United States Patent
Mehrotra

(10) Patent No.: US 12,272,739 B2
(45) Date of Patent: Apr. 8, 2025

(54) FIN-BASED LATERALLY-DIFFUSED METAL-OXIDE SEMICONDUCTOR FIELD EFFECT TRANSISTOR

(71) Applicant: TEXAS INSTRUMENTS INCORPORATED, Dallas, TX (US)

(72) Inventor: Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 307 days.

(21) Appl. No.: 17/098,689

(22) Filed: Nov. 16, 2020

(65) Prior Publication Data
US 2022/0157972 A1     May 19, 2022

(51) Int. Cl.
| | |
|---|---|
| H01L 29/76 | (2006.01) |
| H01L 29/06 | (2006.01) |
| H01L 29/40 | (2006.01) |
| H01L 29/66 | (2006.01) |
| H01L 29/78 | (2006.01) |
| H01L 29/94 | (2006.01) |
| H01L 49/02 | (2006.01) |

(52) U.S. Cl.
CPC ........ H01L 29/66795 (2013.01); H01L 28/20 (2013.01); H01L 29/0696 (2013.01); H01L 29/402 (2013.01); H01L 29/6653 (2013.01); H01L 29/66689 (2013.01); H01L 29/7816 (2013.01); H01L 29/7851 (2013.01); H01L 29/94 (2013.01)

(58) Field of Classification Search
CPC ................................................ H01L 29/66795
See application file for complete search history.

(56) References Cited

U.S. PATENT DOCUMENTS

| | | | | |
|---|---|---|---|---|
| 10,164,006 B1* | 12/2018 | Ciavatti | ............ | H01L 21/02008 |
| 2008/0265290 A1* | 10/2008 | Nielsen | ................. | H01L 29/785 |
| | | | | 257/288 |
| 2011/0127610 A1* | 6/2011 | Lee | ................. | H01L 21/823431 |
| | | | | 257/E27.06 |
| 2015/0162439 A1* | 6/2015 | Hoentschel | ....... | H01L 29/66659 |
| | | | | 257/77 |
| 2017/0194487 A1* | 7/2017 | Chen | ................... | H01L 29/0649 |
| 2020/0135917 A1* | 4/2020 | Singh | ................. | H01L 29/0878 |

OTHER PUBLICATIONS

Pritiskutch, John and Hanson, Brett. "Understanding LDMOS Device Fundamentals." AN1226 Application Note. STMicroelectrics, Jul. 2000, pp. 1-4.
Wu, Yi-Ting et al. "Simulation-Based Study of Hybrid Fin/Planar LDMOS Design for FinFET-Based System-on-Chip Technology." IEEE Transactions on Electron Devices, vol. 64, No. 10, Oct. 2017, pp. 4193-4199.

* cited by examiner

*Primary Examiner* — Ali Naraghi
(74) *Attorney, Agent, or Firm* — Andrew R. Ralston; Frank D. Cimino

(57) ABSTRACT

In some implementations, a method includes forming first and second fins on a semiconductor substrate. The method further includes diffusing first and second implants into the semiconductor substrate and first and second fins. The method also includes patterning a field plate on the semiconductor substrate. An active device, such as a laterally-diffused metal-oxide semiconductor field effect (LDMOS) transistor can be formed in this way.

21 Claims, 23 Drawing Sheets

FIN-BASED LATERALLY-DIFFUSED METAL-OXIDE SEMICONDUCTOR FIELD EFFECT TRANSISTOR

BACKGROUND

One type of transistor is a planar, laterally-diffused metal-oxide semiconductor field effect (LDMOS) transistor. An LDMOS transistor generally includes a diffused p-type channel region in a low-doped n-type drain region. The low doping for the drain results in a large depletion layer with high blocking voltage.

SUMMARY

In at least one example, a method includes forming first and second fins on a semiconductor substrate. The method further includes diffusing first and second implants into the semiconductor substrate and first and second fins. The method also includes patterning a field plate on the semiconductor substrate.

In another example, a semiconductor structure includes a semiconductor substrate and a fin patterned in the semiconductor substrate. The fin has a longitudinal axis. A gate dielectric covers at least a portion of the fin and at least a portion of the substrate. A gate covers a portion of the fin and has a longitudinal axis orthogonal to the longitudinal axis of the fin. A field plate has a longitudinal axis orthogonal to the longitudinal axis of the fin. The semiconductor structure also includes first and second doped layers formed on the substrate and fin.

BRIEF DESCRIPTION OF THE DRAWINGS

For a detailed description of various examples, reference will now be made to the accompanying drawings in which.

DETAILED DESCRIPTION

LDMOS transistors are characterized by, for example, specific on-resistance (Rsp), breakdown voltage (BDV), and safe operating area (SOA). Rsp is the on-resistance normalized by top area (i.e., on-resistance per unit area). BVD is the voltage at which the reverse-biased body-drift diode breaks down and significant current starts to flow between source and drain by the avalanche multiplication process, while the gate and source are shorted together. SOA is the voltage and current conditions over which a transistor operates without permanent damage or degradation. Unfortunately, attempts to design an LDMOS transistor to reduce Rsp may result in a reduced BDV, while attempts to increase the device's BDV may result in a higher RSP. SOA also may suffer in an attempt to make a transistor with, for example, lower RSP. In other words, there is usually a trade-off between Rsp, BDV, and SOA.

The transistor structure described herein is a fin-based LDMOS transistor in which both Rsp and BDV are improved. As will be seen in the figures, the transistor structure described herein includes "fins" formed in silicon in a rectilinear or circle and spoke pattern. The aspect ratio and pitch of the fins are chosen to provide substantial area efficiency for a given technology node and processing capability. In various examples, wafers with such fins are patterned and implanted with dopants to form a double-diffused region along the sidewall, bottom, and top surfaces of the fins. An oxide layer is then provided on the gate region of the transistor. A nitride may then be deposited, patterned, and etched followed by thermal oxidation to define a thicker oxide in the field regions. At least some of the nitride is then stripped away by gate electrode deposition. The gate is then patterned and etched. Field plates also may be patterned during the process to define the gate. Such field plates function to control the electric potential distribution along the drift regions while reducing any local increase in electric field thereby resulting in improved BDV and specific on-resistance.

Figure 1:
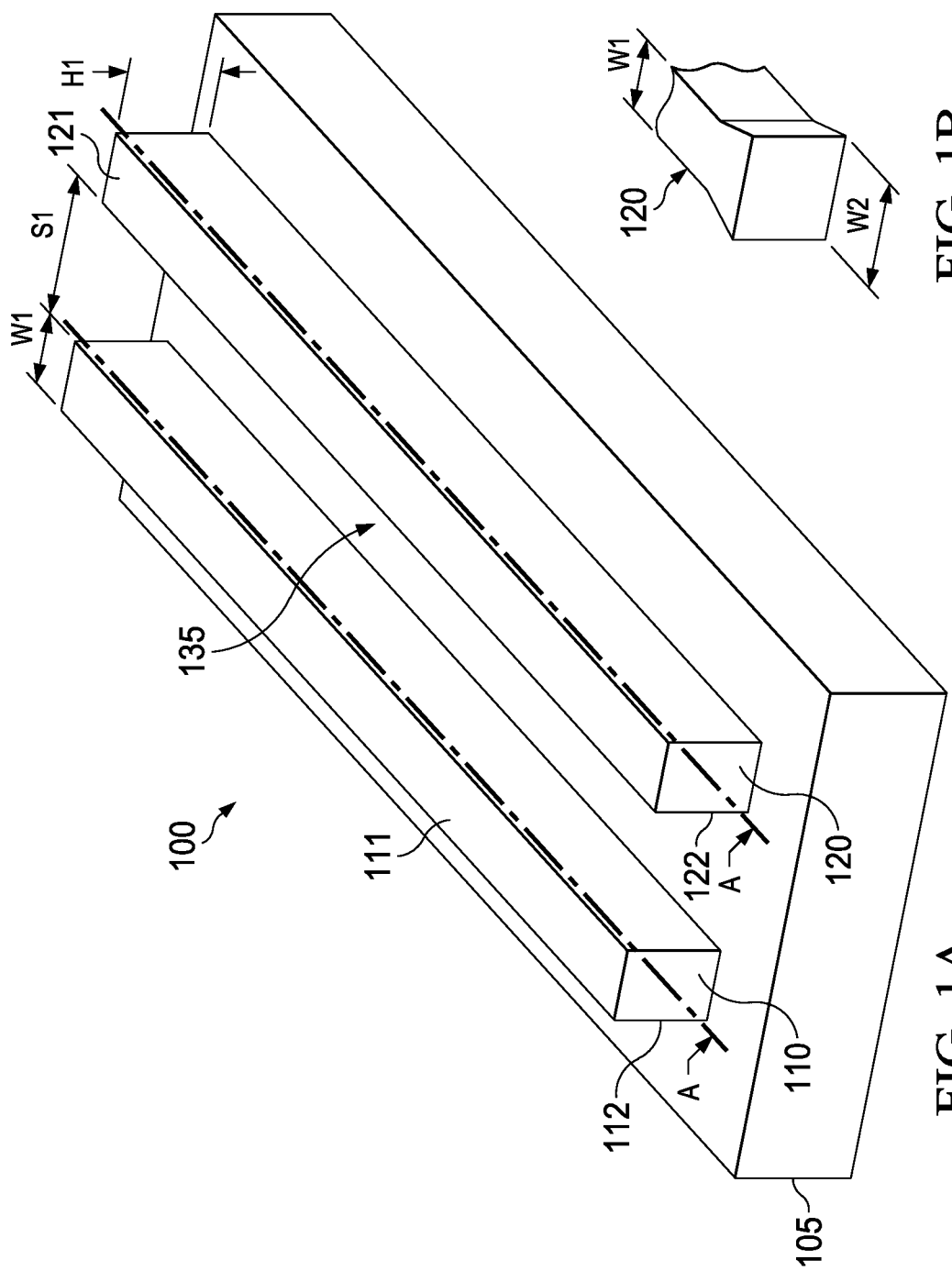
FIG. 1A illustrates an electronic device, e.g. a portion of an integrated circuit at an early stage of formation, at which fins have been formed over a semiconductor substrate.
FIGS. 1B and 1C illustrate additional examples of the shapes of the fins shown in FIG. 1A.

FIGS. 1A-16 illustrate a sequence of process operations to form an illustrative fin-based LDMOS transistor 100. FIG. 1A illustrates a silicon substrate 105 in which fins 110 and 120 have been fabricated. While the silicon substrate 105 may be elemental silicon or other suitable semiconductor material such as Ge, SiGe or GaAs, examples described herein may use silicon as a nonlimiting example. The fins 110, 120 include mesas 111 and 121, respectively. Each fin has a longitudinal axis A. Axes A are parallel to each other. A trench 135 between the fins results from the formation of the fins. In one example, the fins 110, 120 are the result of application of a photoresist mask and then etching (e.g., etching the silicon where the photoresist mask is not present). Fins 110 and 120 extend parallel to one another in this example. Two fins 110, 120 are shown in the example of FIG. 1A, but a single fin, or more than two fins, can be provided in other examples. The example shown in FIG. 1A is of rectilinear fins 110, 120, e.g. having a rectangular cross-section. The term "rectangular" includes "square". Moreover, it is recognized that in semiconductor manufacturing sidewalls of line-type features are sometimes not parallel, e.g. the fins 110, 120 may have another cross section that is approximately rectangular, e.g. trapezoidal. Herein a fin is defined as having a "rectangular cross section" if opposite sides along the long dimension of the fin are within 5° of parallel. The height of the fins is H1 and their width is W1. The distance (pitch) between the fins is S1. In one example, H1 is 0.5 micrometers (microns), W1 is 0.5 microns, and S1 is 0.5 microns. The fins, however, may have shapes other than rectilinear. For example, as shown in FIG. 1B, the ends 112 and 122 of fins 110 and 120 (fin 120 is shown) may be wider (W2) than the rest of the fin length (W1) to provide a larger surface area for other structures (e.g., source or drain landing pads) to be formed on the ends. Alternatively, as illustrated in FIG. 1C, the ends 112, 122 of the fins may be tapered (or oval) to a width W3 (W3 is less than W1), which may improve doping at the edges of the fins.

Figure 2:
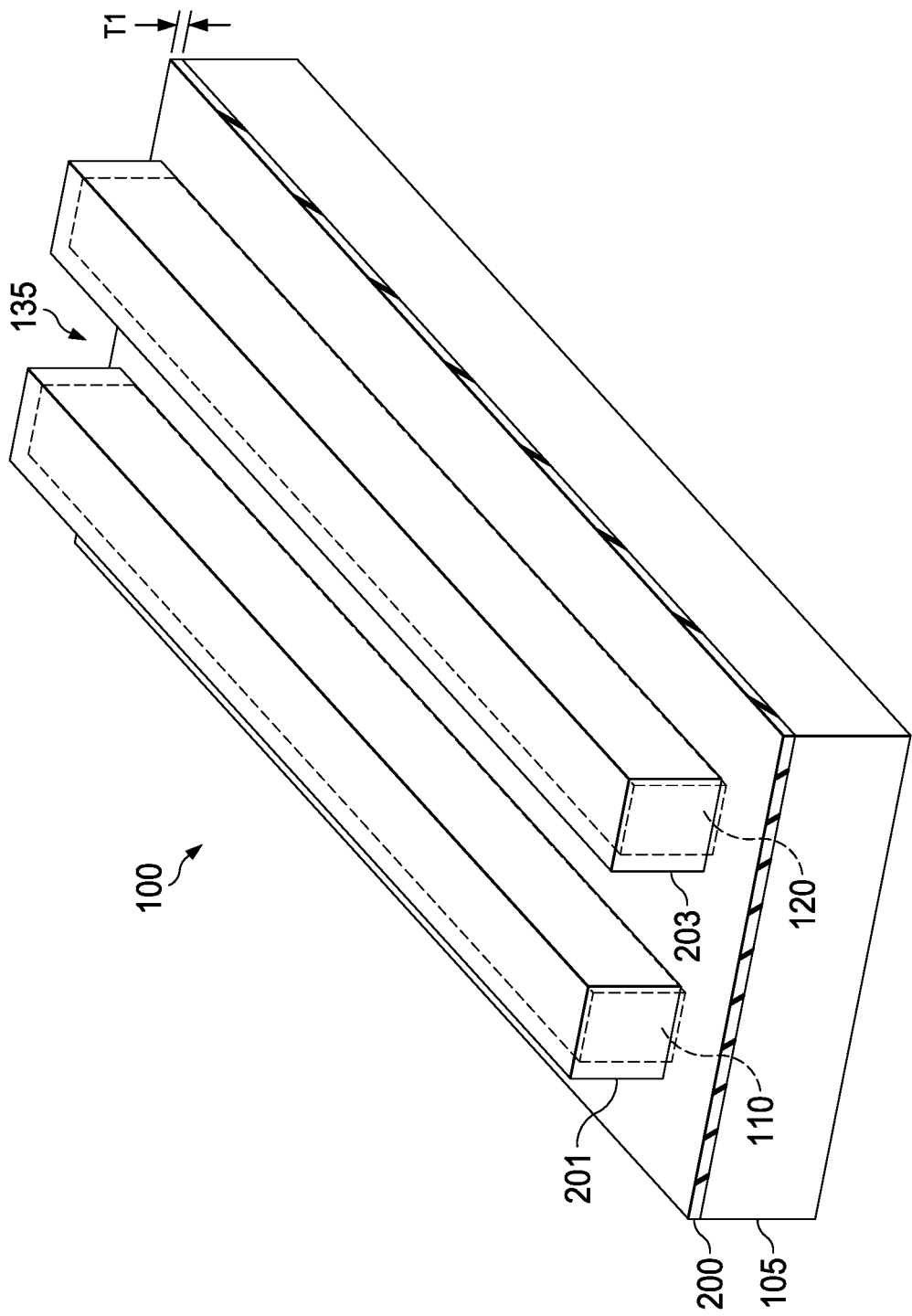
FIG. 2 illustrates the device after a thick dielectric layer is formed over exposed surfaces of the substrate and fins.

FIG. 2 illustrates a thick dielectric layer 200 (e.g., silicon dioxide) formed over the fins 110, 120 and the trench 135 therebetween. The term "thick dielectric layer" is used without implied limitation to distinguish from other dielectric layers that may have a thickness less than the dielectric layer 200. The dielectric layer 200 may be considered analogous to a field plate oxide of a planar extended-drain MOS transistor. The thickness T1 of the dielectric layer 200 is of sufficient thickness to support the desired gate voltages. That is, T1 is application-specific. Either before or after the formation of fins 110 and 120, the structure can be implanted with channel, field gate, result and other implants (p-type implants or n-type implants such as boron, arsenic, phosphorous, etc.). Performing the implants before fin formation may facilitate the implants to penetrate the dielectric layer 200 without being reflected by the fins. In some examples, dielectric spacers are formed on the sidewalls 201 and 203 of the fins. Isolation implants can then be applied to the silicon substrate at the base of the fins (e.g., in trench 135) and annealed to create a merged region forming junction-isolated fins (i.e., isolating the fins from the substrate 105).

Figure 3:
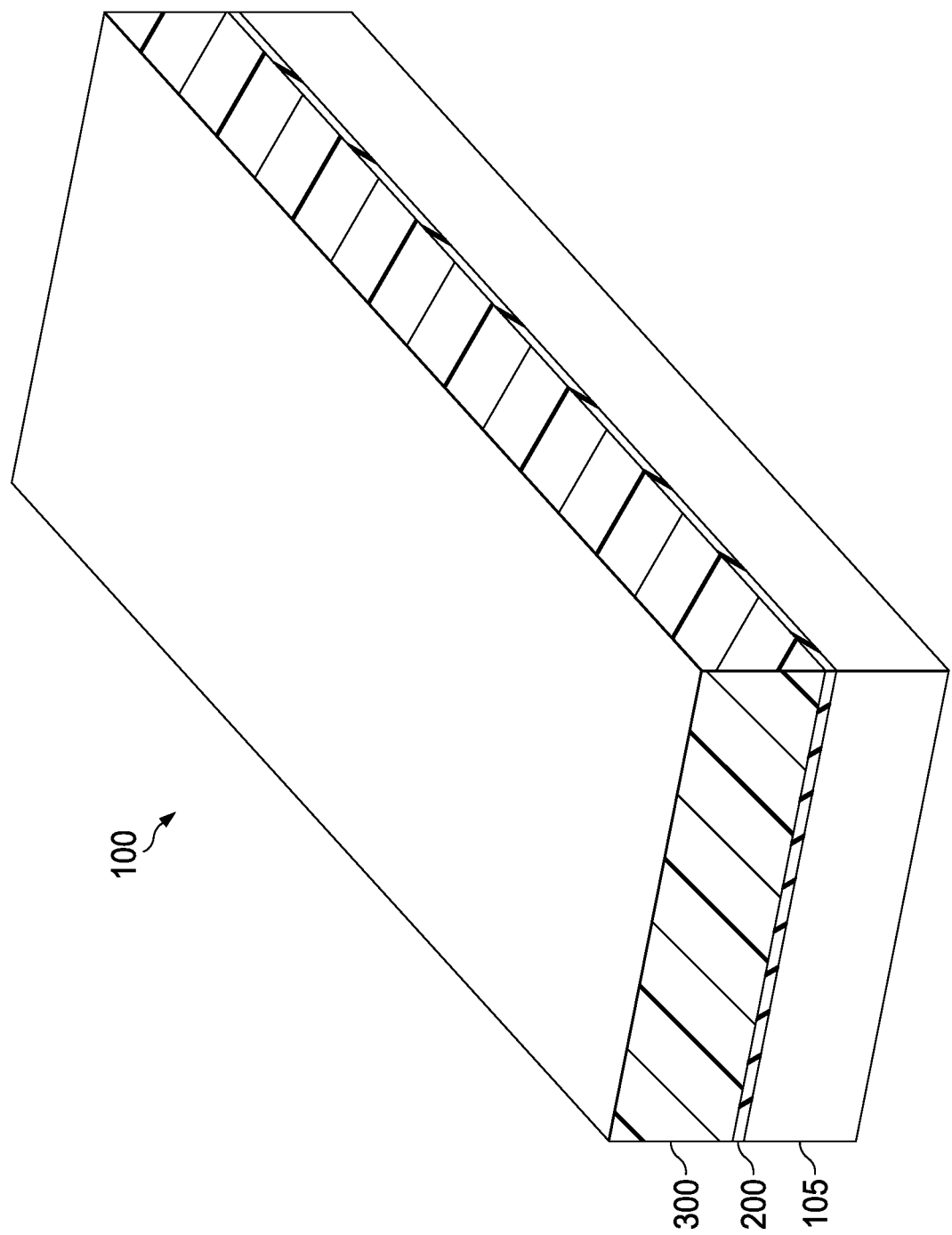
FIG. 3 illustrates the device after forming a layer of photoresist over the thick dielectric layer.
Figure 4:
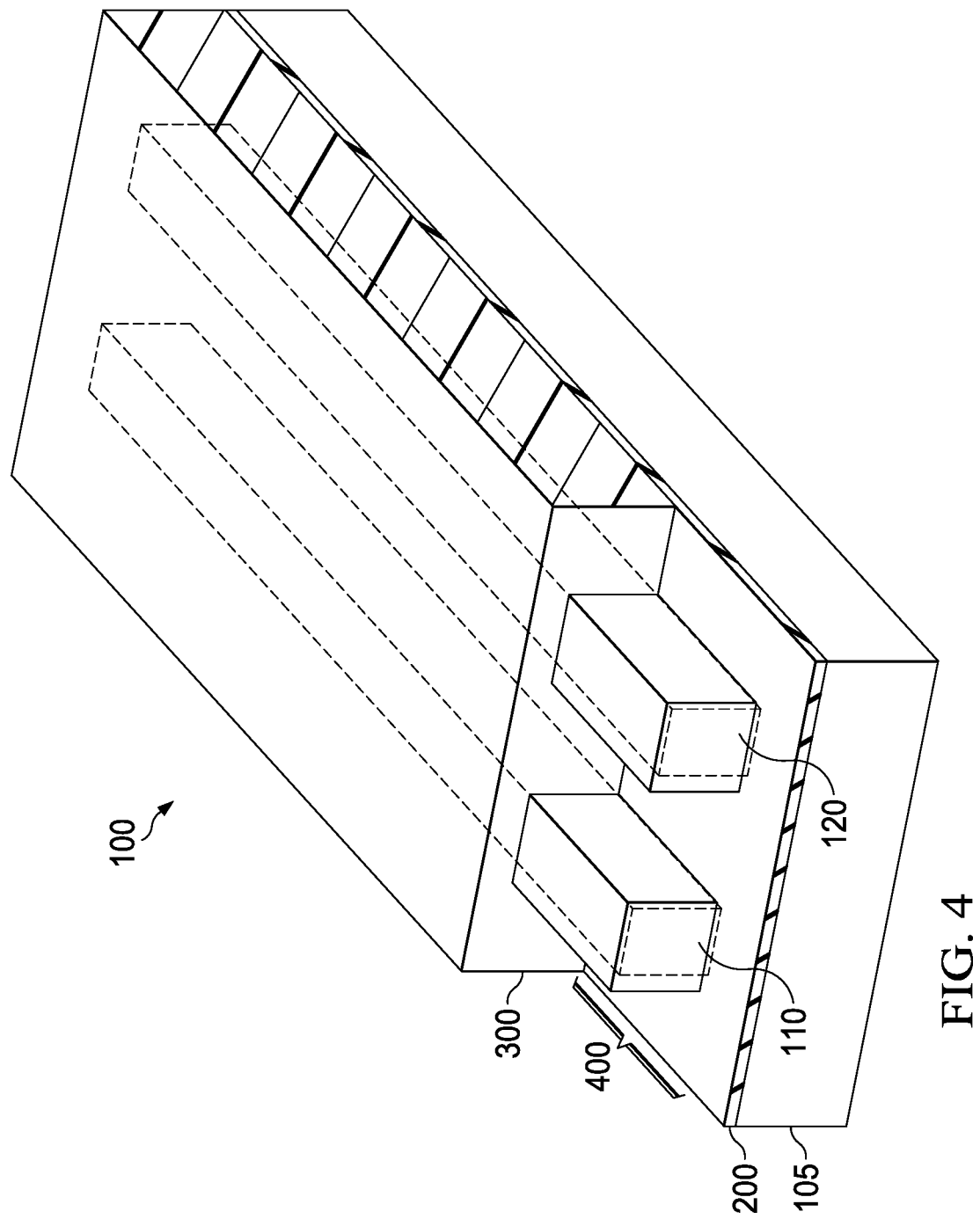
FIG. 4 illustrates the device after patterning the photoresist of FIG. 3 to expose a first end of the fins, e.g. a source end.
Figure 5:
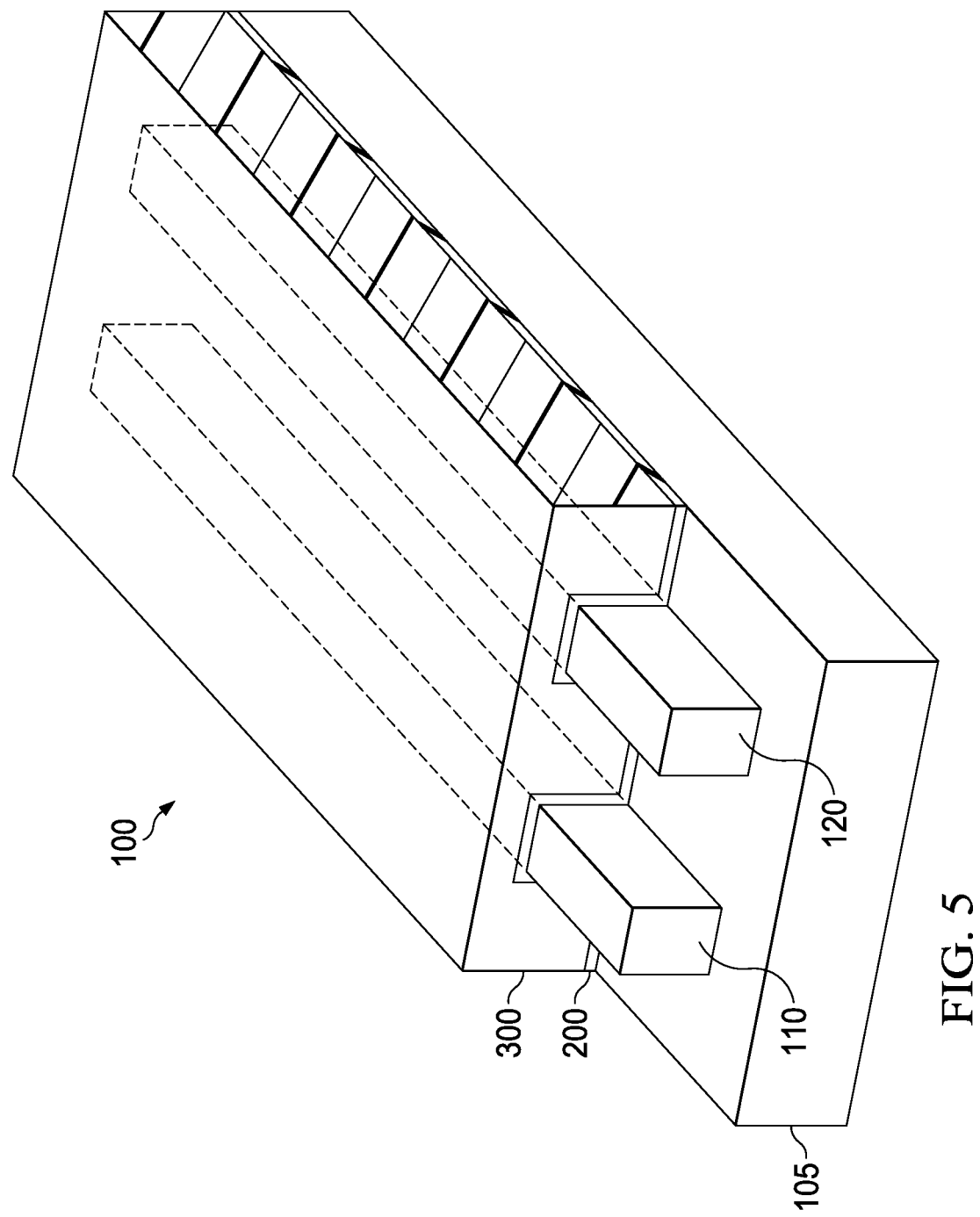
FIG. 5 illustrates the device after removing the dielectric layer exposed by the open are of the patterned photoresist layer, thereby exposing the underlying silicon substrate including a portion of the fins.

FIG. 3 illustrates that photoresist 300 has been added to cover the dielectric layer 200. FIG. 4 illustrates that the photoresist 300 is then patterned (e.g., using a mask). As shown, the portion of the photoresist that had been covering an area 400 of the dielectric layer 200 has been removed. FIG. 5 illustrates that the dielectric layer 200 in the area 400 (i.e., the portion of the dielectric layer 200 exposed after the patterning of the photoresist 300) is removed thereby exposing the underlying substrate 105 including a portion of fins 110 and 120. The removal of the dielectric layer 200 in the area 400 is removed in accordance with any suitable technique such as a wet etch process or a plasma etch process.

Figure 6:
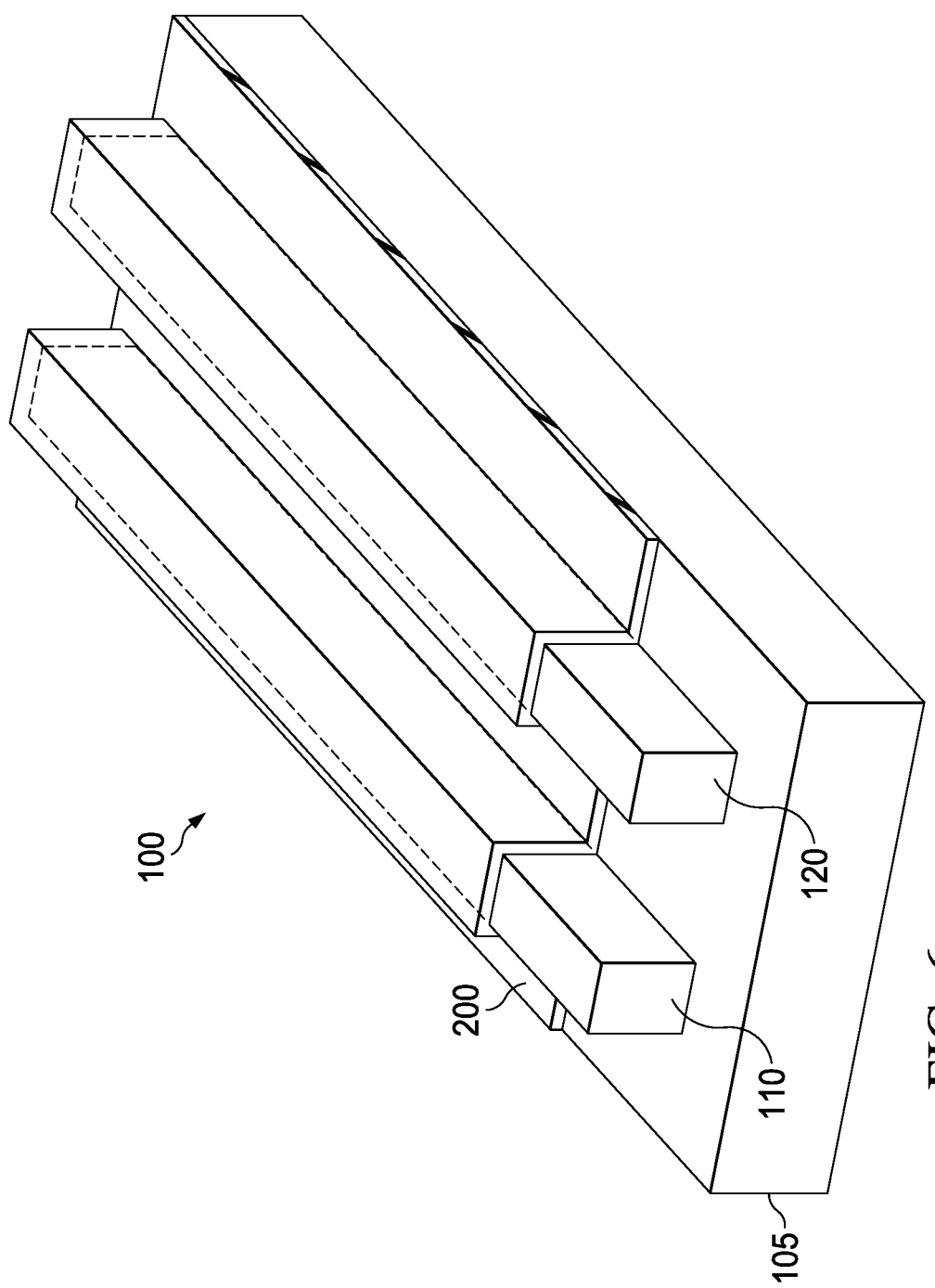
FIG. 6 illustrates the device after removing the photoresist layer, including a remaining portion of the dielectric layer on the fins and silicon substrate.

In FIG. 6, photoresist 300 (shown in FIG. 5) has been removed thereby exposing the underlying dielectric layer 200. Photoresist 300 can be removed in accordance with any suitable technique such as by plasma resist ash and wet clean processes.

Figure 7:
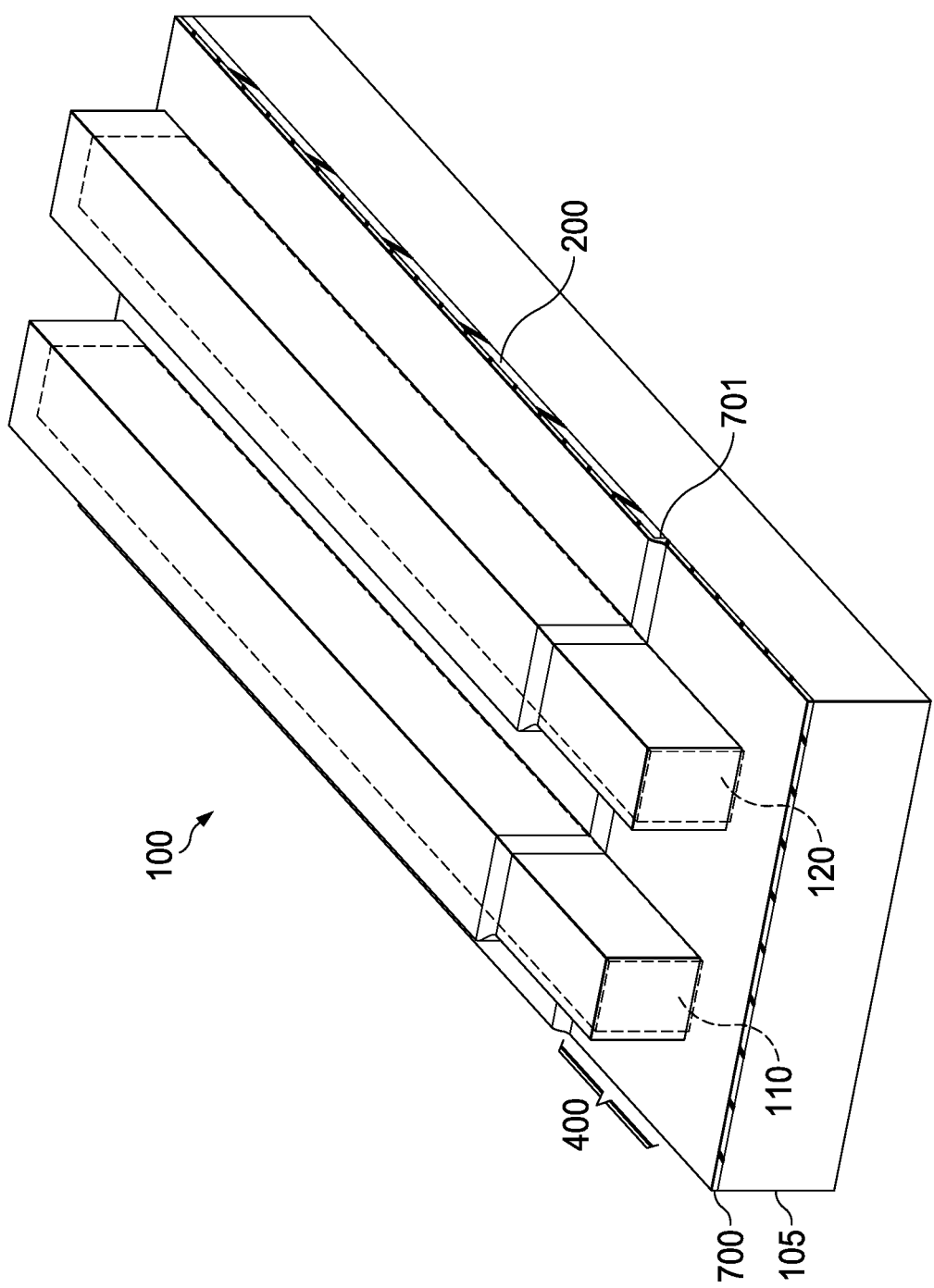
FIG. 7 illustrates the device after formation of a gate dielectric layer on the exposed silicon surfaces of shown I FIG. 6.

FIG. 7 illustrates the LDMOS transistor 100 after forming a gate dielectric layer 700 (e.g., thermally-grown silicon dioxide) over the dielectric layer 200 and the exposed substrate 105 including the exposed fins 110, 120 in the area 400. The gate dielectric layer 700 is generally uniform with a thickness of about 1 nm in the area 400 and merges with the dielectric layer 200 at a thickness transition 701.

Figure 8:
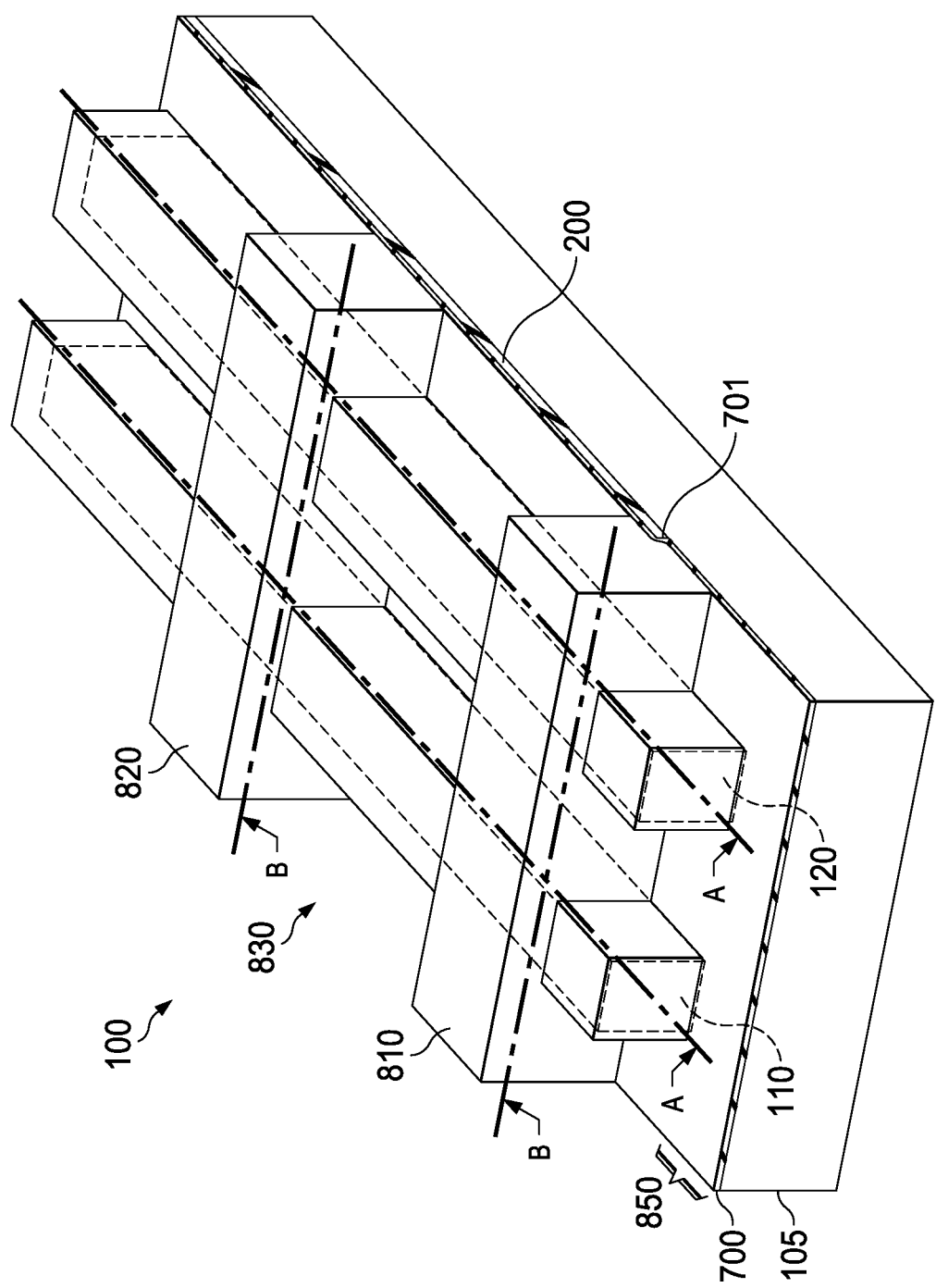
FIG. 8 illustrates the device after formation of conductive lines, e.g. a polysilicon gate electrode and a polysilicon field plate, over the structure shown in FIG. 7.

In FIG. 8, polycrystalline silicon (also referred to as polysilicon) has been deposited over the structure shown in FIG. 7. The polysilicon is then polished to form a uniform top surface, patterned (e.g., using photoresist), and then etched (e.g., plasma etching) to form the gate 810 and a field plate 820. In other embodiments, the polysilicon is not polished and conforms to the contours of the fins. Further still, instead of using polysilicon to form the gate, the gate can made from a metal and a gate dielectric with a high-K dielectric constant. As shown, the gate 810 covers a portion of the fins 110, 120 overlapping the transition 701 of the dielectric layer 200. Similarly, the field plate 820 also covers a portion of the fins 110, 120, and is spaced apart from gate 810. As such, a portion of the fins 110, 120 is exposed in region 830 between the gate 810 and the field plate 820. The gate 810 and the field plate 820 have longitudinal axes B that are orthogonal to the axes A of the fins.

Figure 9:
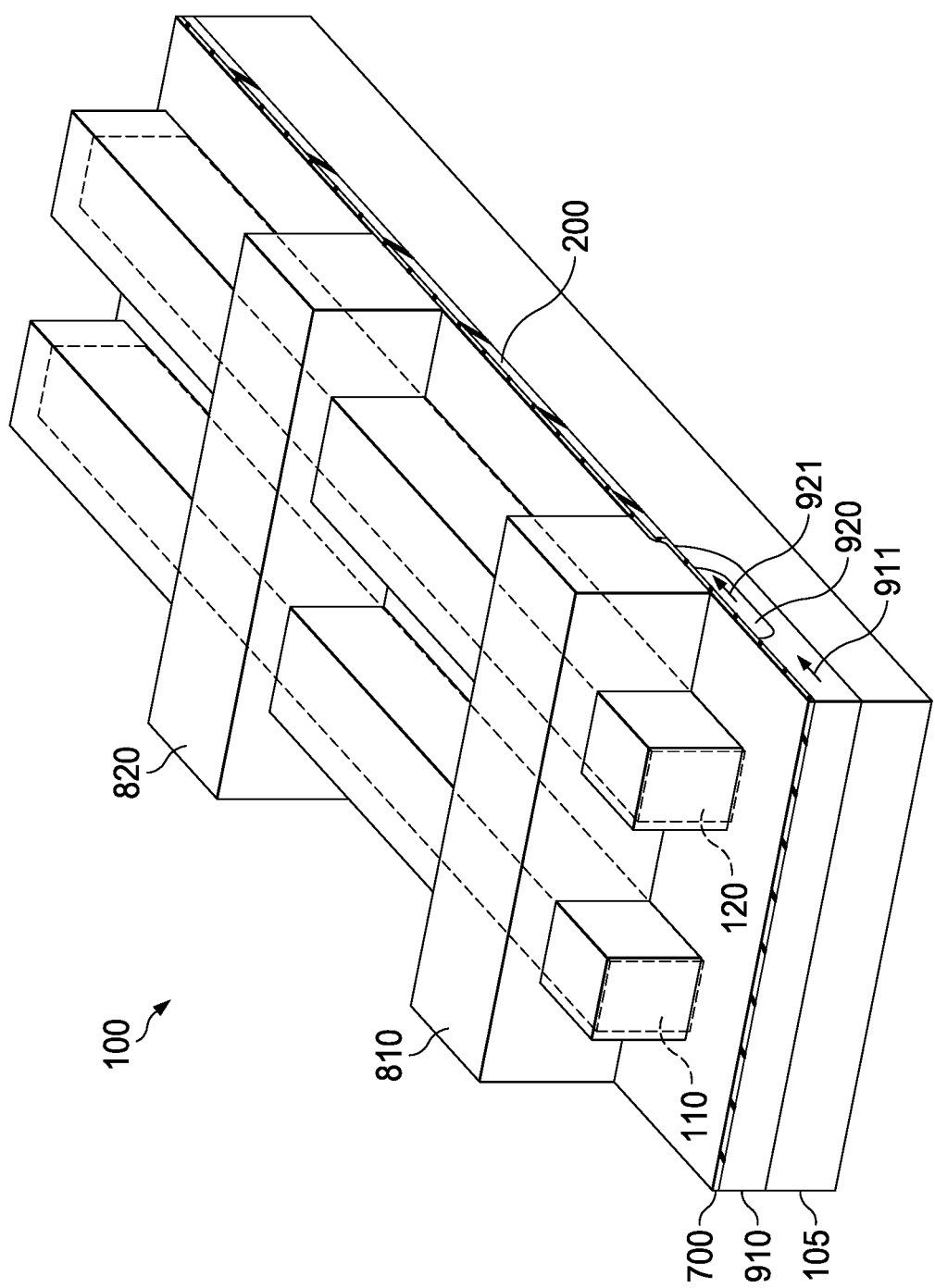
FIG. 9 illustrates the device after forming a well region that extends under the gate electrode, and a source region within the well region.

FIG. 9 illustrates the device 100 after forming a well region 910 and a source region 920 within the well region 910. Continuing the current example, without implied limitation, the well region 910 may be P-type and the source region 920 may be N-type, consistent with an NMOS device. Furthermore the well region 910 may be double-diffused, e.g. a DWELL, and may be referred to as such without implied limitation. Dopants may be applied to the substrate 105 by implantation, a plasma immersion process, a solid-state source process, or other suitable process. In one example the well region 910 is doped with boron and the source region 920 is doped with arsenic or phosphorous. The transfer of the dopants to the substrate 105 may be self-aligned to the gate 810, with the resulting illustrated extension of the well region 910 and source region 920 under the gate 810 resulting from diffusion of the dopants in an anneal process. A portion of the well region 910 that intersects the gate dielectric layer 700 under the gate 810 forms at least a portion of the channel region of the LDMOS transistor 100. The well 910 may also operate as the body of the LDMOS transistor 100. After doping the well region 910, an anneal may drive the dopant through the substrate 105 underneath the gate 810 as indicated by arrow 911. Similarly, after doping the source region 920, an anneal may drive the dopant in both the well region 910 and the source region 920 through the substrate 105 underneath the gate 810 as indicated by arrow 921. The well region 910 extends farther under the gate 810 than source region 920 due to, at least in part, a longer anneal period for the well region 910 than for the source region 920. Alternatively the well region 910 and the source region 920 may be formed after forming the fins 110, 120 but before the process flow shown in FIGS. 3-9 is performed.

Figure 10:
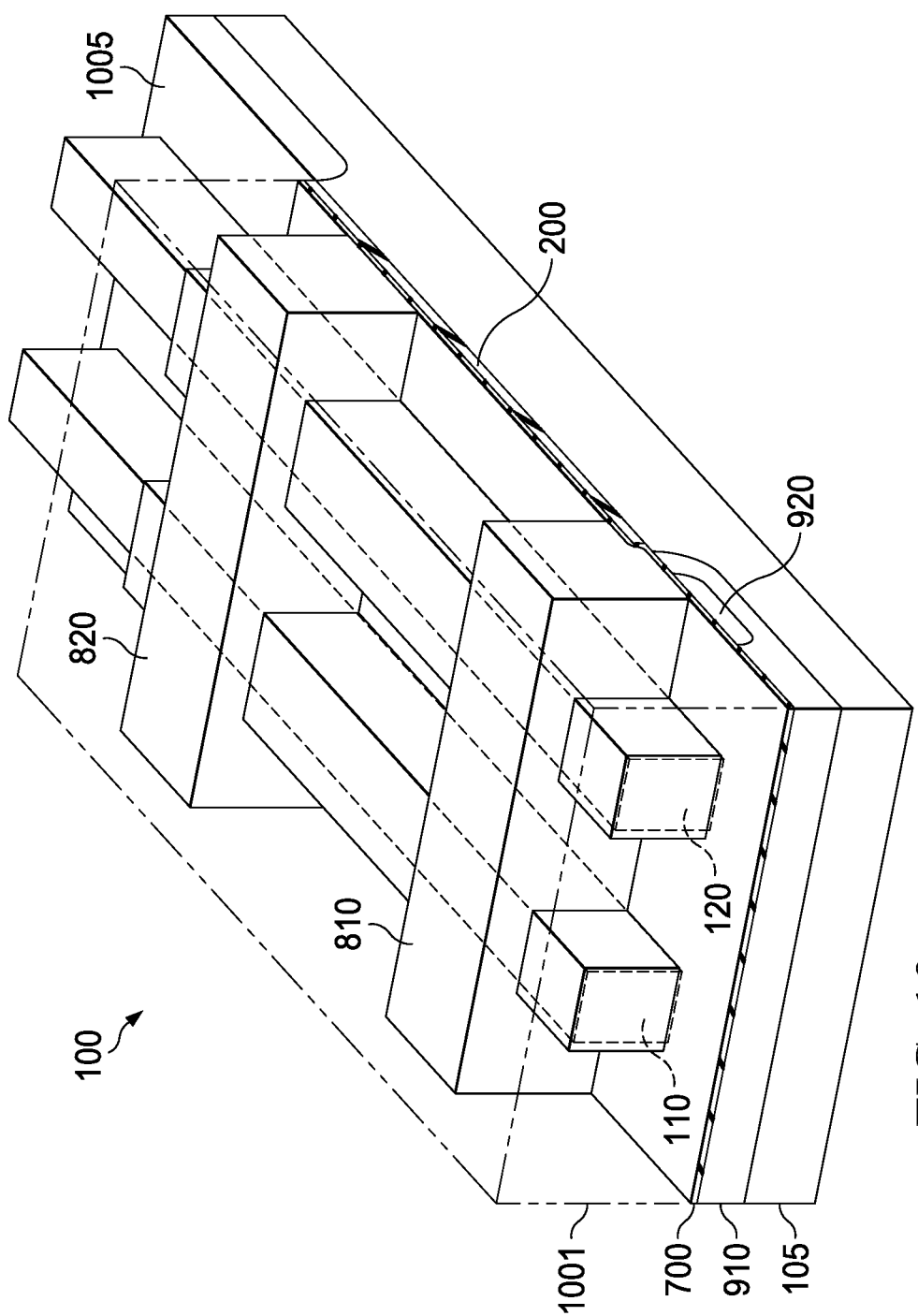
FIG. 10 illustrates the device after forming a drain region that extends under the fins.

FIG. 10 illustrates a photoresist layer 1001 formed over the structure except where a suitable dopant is implanted silicon is implanted to form a drain region 1005. The source and drain regions can alternatively be formed after fin formation but before the process flow shown in FIGS. 3-9 is performed.

Figure 11:
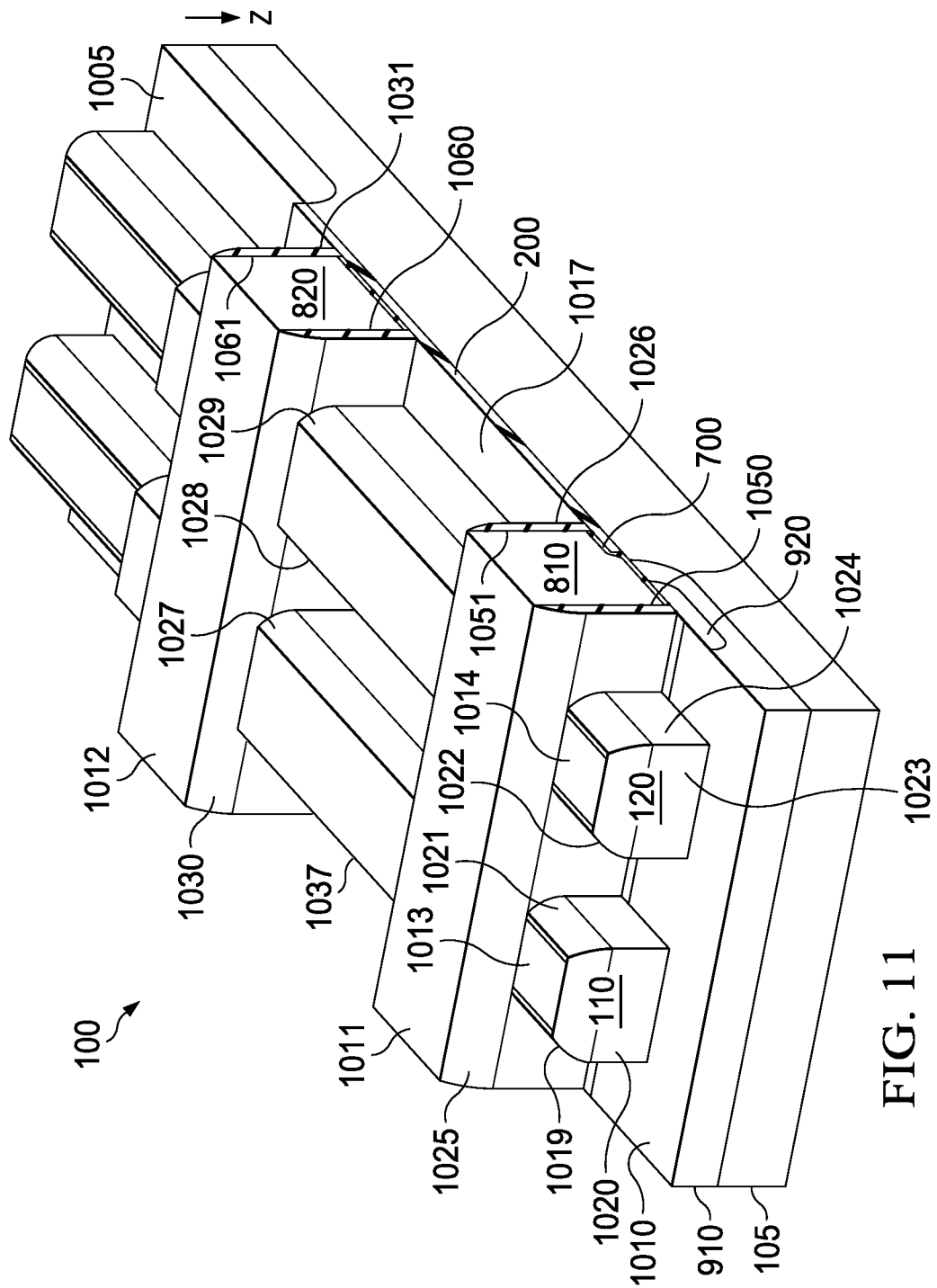
FIG. 11 shows the device after forming sidewalls over the fins, gate electrode and field plate shown in the structure of FIG. 10, and exposing silicon surfaces of portions of the fins, gate electrode and field plate.

After removal of the photoresist layer 1001, one or more dielectric layers (e.g., silicon dioxide followed by silicon nitride, not shown) are deposited over the structure shown in FIG. 10 and a directional etch process (e.g., plasma etching) is then performed thereby resulting in the LDMOS transistor 100 structure shown in FIG. 11, including sidewall spacers 1019-1031. The sidewall spacers 1019-1031 result from a directional etch performed along the direction Z of the added dielectric layer(s). Dielectric material has been etched away (removed) from the horizontal surface 1010 of the substrate 105, horizontal surface 1011 of the gate 810, horizontal surface 1012 of the field plate 820, horizontal surface 1013 of fin 110, and horizontal surface 1014 of fin 120. The etch has also removed exposed portions of the gate dielectric layer 700, with remaining protected portions located under the gate 810 and the field plate 820. What is left of the added dielectric layer forms the spacers 1019-1031 in the source region and unreferenced spacers in the drain region. That is, due to the directional etch process, the vertical walls of the three-dimensional structure of FIG. 11 includes dielectric material that is thinner near the top horizontal surfaces and thicker near the bottom of each vertical wall. The exposed vertical walls of the fin 110 are covered by the spacers 1019-1021 and, between the gate 810 and the field plate 820, spacers 1037 and 1027. Similarly, the exposed vertical walls of the fin 120 are covered by spacers 1022-1024 and, between the gate 810 and the field plate 820, spacers 1028 and 1029. The exposed portions of opposing vertical walls 1050 and 1051 of the gate 810 are covered with spacers 1025 and 1026, respectively. Similarly, the exposed portions of opposing vertical walls 1060 and 1061 of the field plate 820 are covered with spacers 1030 and 1031, respectively. The spacers 1019-1031 may be useful to space the source/drain and/or silicided regions away from the gate 810 thereby tailoring the electron path through the source or channel. After spacer formation, the source and drain regions are formed by suitable methods such as implants and anneals or by raised source/drain using selective epitaxy. Fin formation sometimes involves the use of a hard mask when material is removed between the fins. In some examples, the spacers 1019-1031 are formed before such mask is removed from the tops of the fins. The thick dielectric layer 200 is also still present on the fins 110 and 120 in the region between the gate 810 and the field plate 820 and on the fins 110, 120 underneath the field plate 820 and up to the drain region 1005. The dielectric layer 200 has been removed from over the well region 910 and the drain region 1005 to thereby facilitate silicide formation in those regions as discussed below with reference to FIG. 12.

Figure 12:
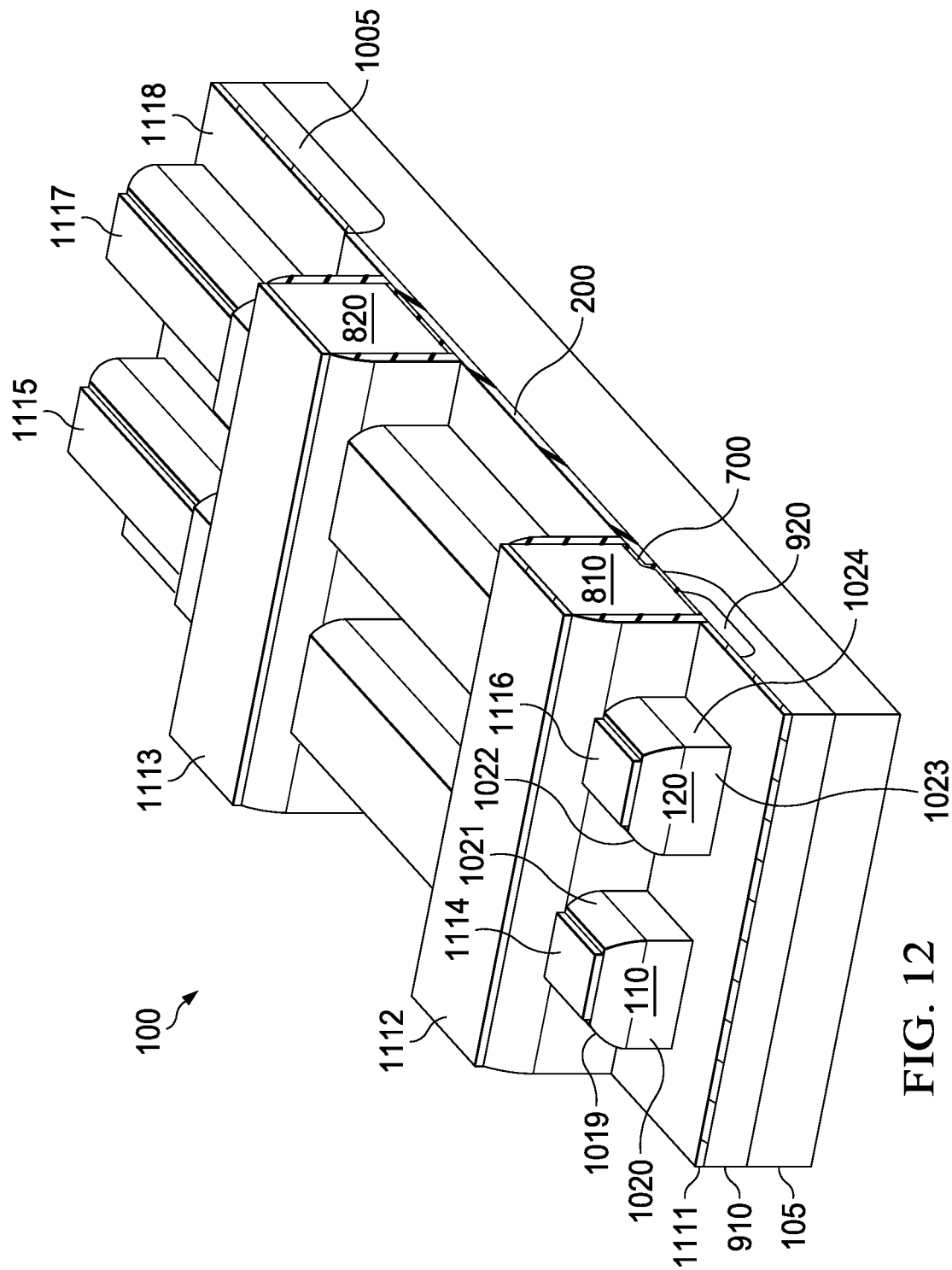
FIG. 12 illustrates the device after forming silicided metal on the exposed silicon surfaces of FIG. 11.

A silicide metal (e.g., nickel) is then deposited on surfaces of the LDMOS transistor 100 and heated to a sufficient temperature to form, for example, nickel silicide between the silicide metal and exposed silicon surfaces. FIG. 12 illustrates silicide layers 1111 and 1118 formed on the horizontal surface 1010 of the substrate 105, silicide 1112 formed on the top of the gate 810, silicide 1113 formed on the top of the gate 810, silicide 1114 and 1115 formed on the top of fin 110 (but not between the gate 810 and field plate 820), and silicide 1116 and 1117 formed the top of fin 120 (outside of the area between the gate 810 and the field plate 820). Unreacted silicide metal on dielectric surfaces may then be removed by a chemical etch.

Figure 13:
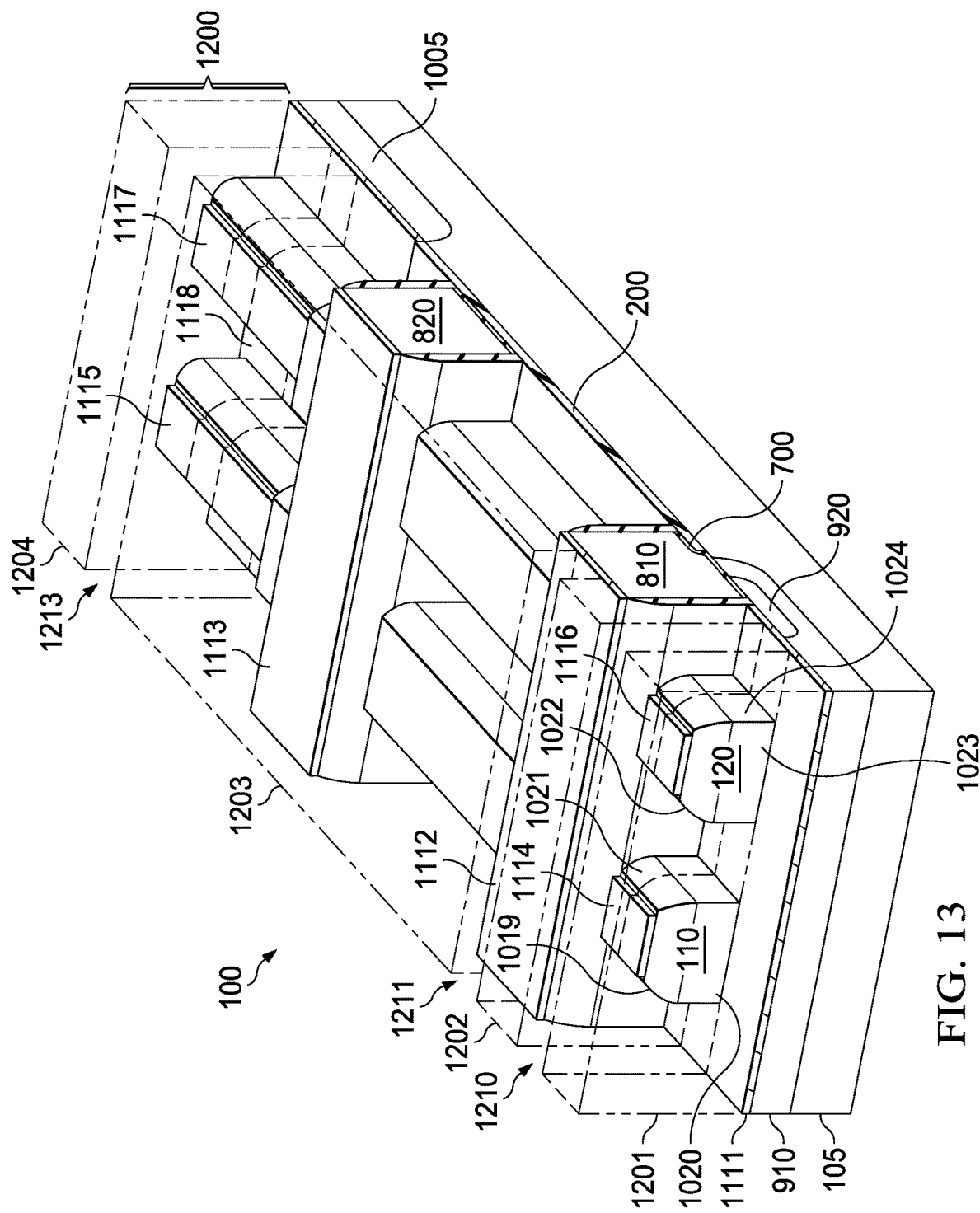
FIG. 13 illustrates the device after forming an interlevel dielectric layer over the structure of FIG. 12, and patterning to form slots over the fins in the source and drain regions, and over the gate electrode.

Referring to FIG. 13, a layer of etch stop nitride (not shown) is deposited followed by the deposition of an oxygen-containing dielectric layer 1200 (e.g., silicon oxide or silicon oxynitride) over the etch stop nitride layer. The dielectric layer 1200 may be planarized, e.g. by polishing, and photoresist is deposited patterned to expose regions of the dielectric layer 1200 in which slots are to be formed. Slots 1210, 1211, and 1213 are then formed in the dielectric layer 1200, e.g. by selective etching. The etching stops at the top of the etch stop nitride layer thereby resulting in dielectric portions 1201, 1202, 1203, and 1204 and slots 1210, 1211, and 1213 therebetween. The etch stop nitride is subsequently removed in the slots by a suitable selective etch. The slot 1210 is formed between the dielectric portions 1201 and 1202, the slot 1211 is formed between the dielectric portions 1202 and 1203, and the slot 1213 is formed between the dielectric portions 1203 and 1204. Through the slot 1211, conductive access is available to the gate 810. Through the slot 1210, conductive access is available to the source ends of fins 110 and 120, and portions of the spacers 1019-1024 are exposed. The drain region 1005 is accessible through the slot 1213. The slots 1210, 1211 and 1203 may be filled with a suitable conductor by an example process described following. In an alternate example, individual contacts may be formed that connect to the gate 810 and to each of the fins 110, 120 at the source and drain ends.

Figure 14:
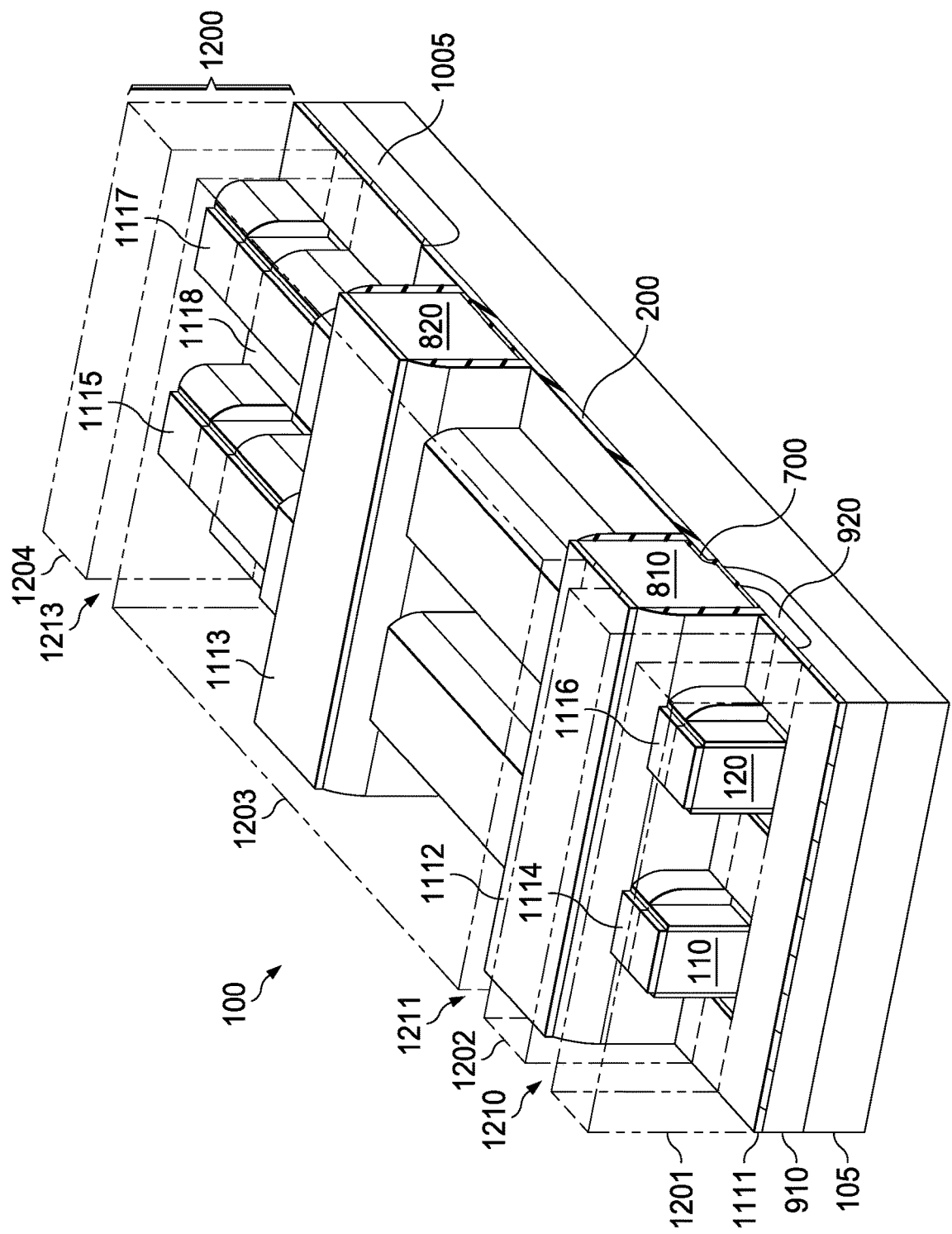
FIG. 14 illustrates the device after removing portions of the sidewall spacers within the slots to expose silicon surfaces the fins in the source and drain regions.

FIG. 14 illustrates the LDMOS transistor 100 after removing portions of spacers 1019-1024 that are exposed through the slot 1210, and removing portions of unreferenced spacers at the drain ends of the fins 110 and 120. Any suitable technique may be used to remove the spacer portions. An example of such a technique includes plasma etching or use of wet etches.

Figure 15:
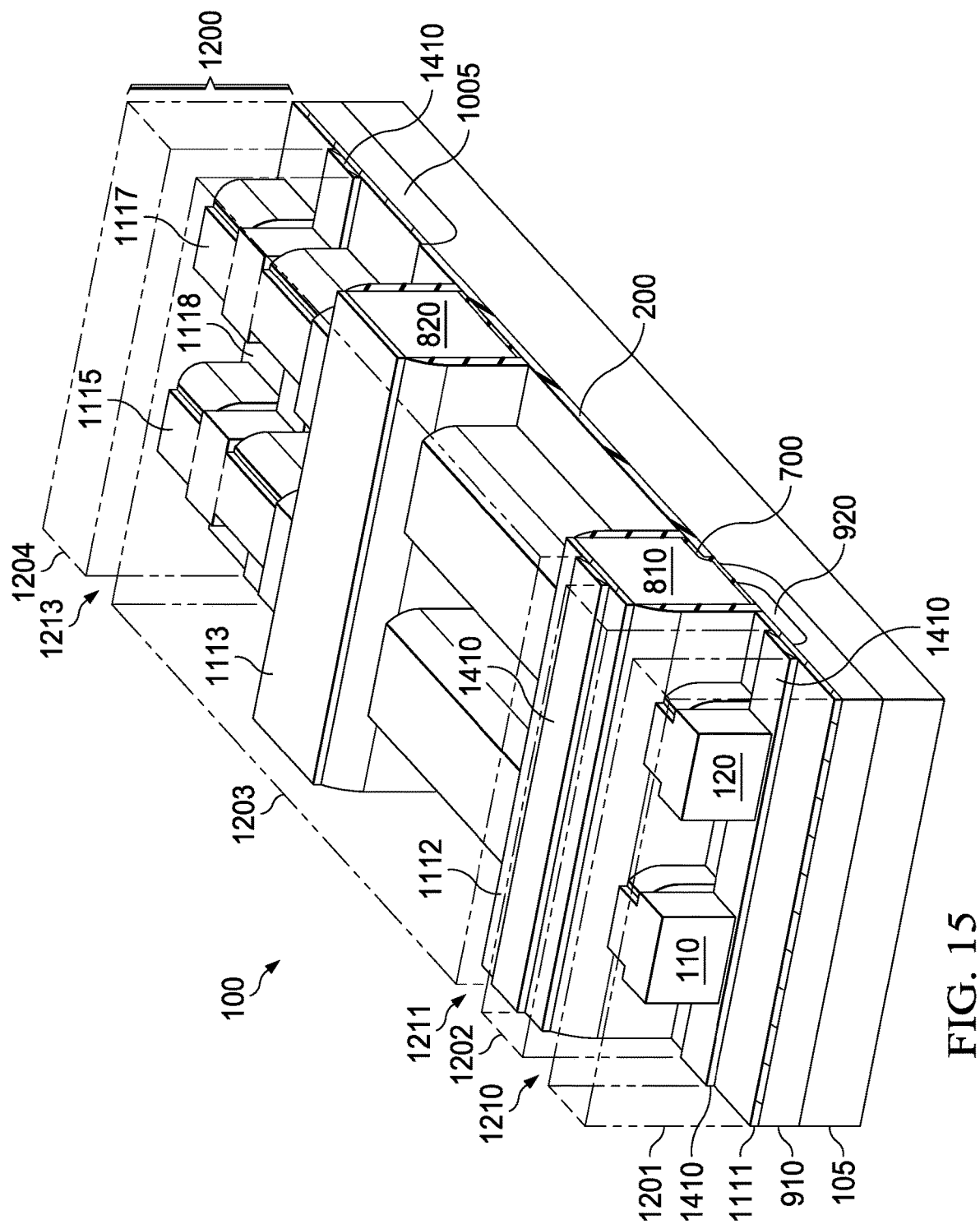
FIG. 15 shows the device after forming a metal silicide on exposed silicon surfaces within the slots formed in FIG. 13.

FIG. 15 illustrates the LDMOS transistor 100 after another layer 1410 of metal 1410 (e.g., nickel) is deposited through slots 1210, 1211, and 1212. The metal 1410 is thermally reacted with silicon exposed within the slots 1210 and 1213, thus forming a continuous silicide layer at the source and drain ends of the fins 110, 120. While the layer 1410 is shown in some locations as a separate layer from the silicide layer 1111, in practice it is expected that a single homogenous silicide layer will result after annealing the layer 1410.

Figure 16:
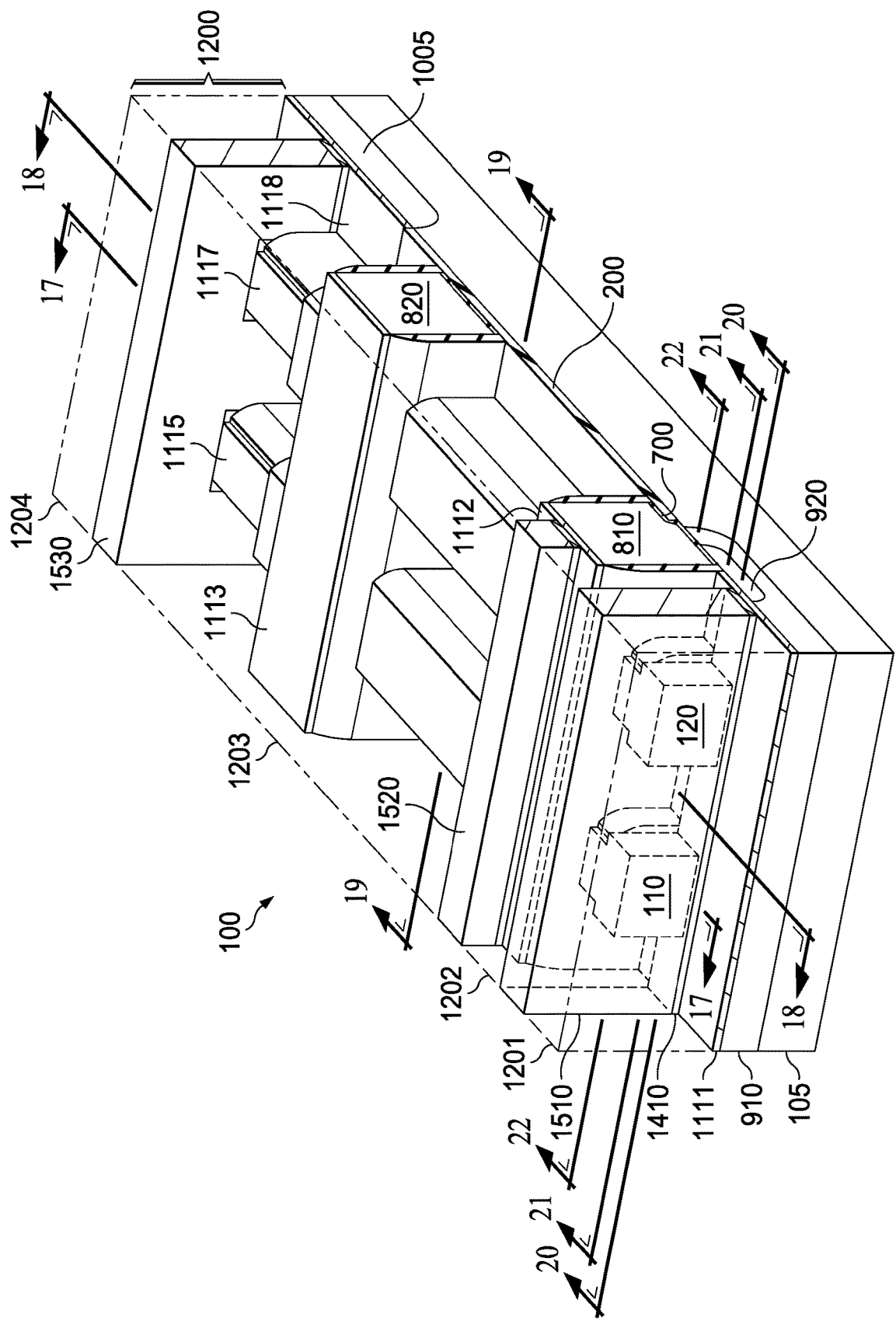
FIG. 16 shows the device after forming metal contacts within the slots over the fins in the source and drain regions, and over the gate electrode.

FIG. 16 illustrates the LDMOS transistor 100 after forming metal contacts 1510, 1520 and 1530. These contacts may be formed by, e.g. copper damascene or tungsten fill. In either method, suitable liners, barriers and fill metal are formed within the slots 1210, 1211 and 1213, and over the dielectric portions 1201, 1202, 1203, and 1204. The metal overburden is removed, e.g. by chemical mechanical polishing (CMP), resulting in the separate metal contacts 1510, 1520 and 1530. The metal contact 1510 provides a conductive electrical contact to the source ends of the fins 110, 120, the metal contact 1530 1510 provides a conductive electrical contact to the drain ends of the fins 110, 120, and the metal contact 1202 provides conductive electrical contact to the gate 810.

FIG. 16 delineates cross-sectional identifiers 17-17 (longitudinally through fin 110), 18-18 (between adjacent fins 110 and 120), 19-19 (transverse through the region between the gate 810 and the field plate 820), 20-20 (transversely through the metal contact 1510), 21-21 (transversely between the metal contact 1510 and the gate 810), and 22-22

(transversely through the gate 810). These cross-sectional views are shown in FIGS. 17-22 and illustrate aspects of the structures and materials described above.

Figure 17:
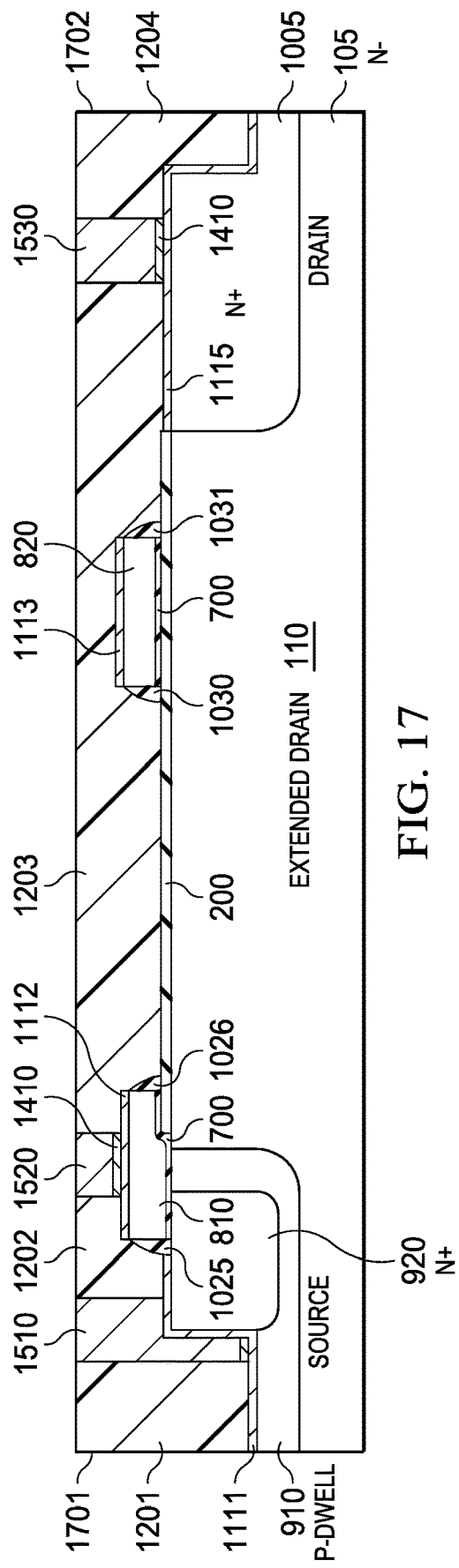
FIGS. 17-22 illustrate cross-sectional views of the device of FIG. 16 at several locations to illustrate relevant features of the device.

The cross-sectional view 17-17 of FIG. 17 illustrates the substrate 105, which, in this example is lightly (N-) doped. The well region 910 (P-type in this example) is shown at end region 1701 and the drain region 1005 is shown at the opposite end 1702. A cross-section of the fin 110 is shown over which cross-sections of the gate 810 and the field plate 820 are located. The dielectric portions 1201, 1202, 1203, and 1204 are located as shown (between and outside the metal contacts 1510, 1520 and 1530). The gate dielectric layer 700 is located under the gate 810 and under the field plate 820. Silicide 1112 and silicide 1113 are provided on the top surfaces of the gate 810 and field plate 820, respectively. Silicide 1115 is provided on the drain region as shown. The metal contacts 1510, 1520, and 1530 provide connectivity to the source region 910, gate 810, and drain region 1005, respectively. Further, spacers 1025 and 1026 are shown formed on opposing sides of the gate 810. Spacers 1030 and 1031 are shown formed on opposing sides of the field gate 820.

As seen by the view of the well region 910 and source region 920, the anneal performed after doping these regions causes the dopants to diffuse toward the drain end of the fin 810, as well as up toward, or to, the top surface of the fin 110. It is also understood, though not explicitly shown, that the well region 910 and source region 920 also intersect the vertical sides of the fin 110. Thus the channel of the LDMOS transistor operates along the sides and the top of the fin 100, providing greater channel width than possible in a planar configuration. Similarly the drain 1005 fills the drain end of the fin 110 and conducts to the drain contact 1530 through top and side surfaces.

Figure 18:
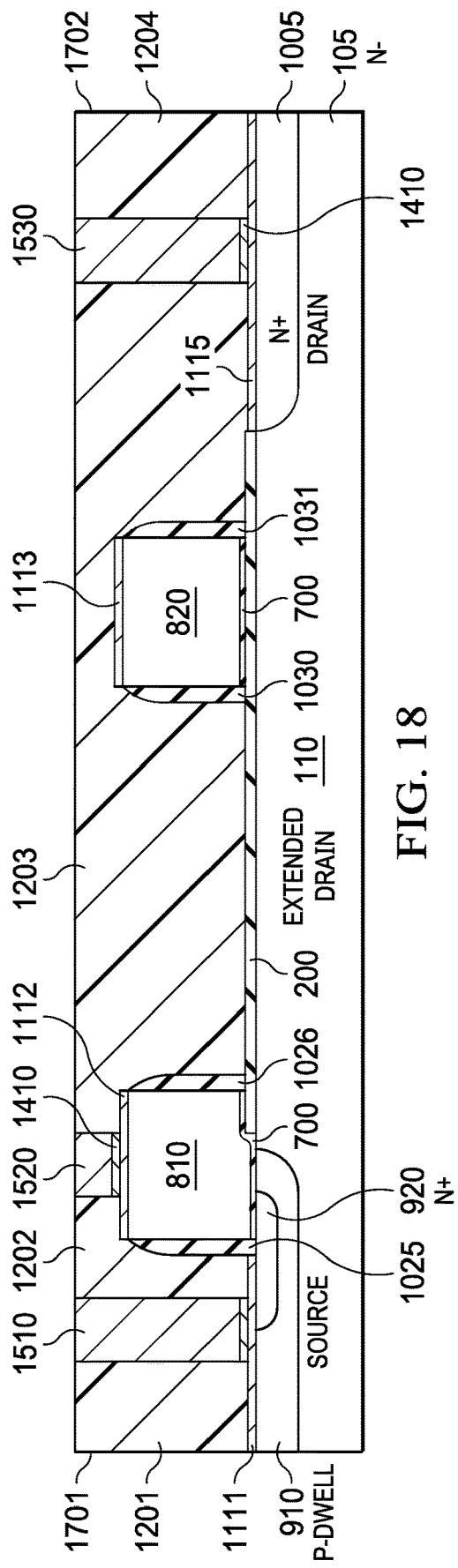

Cross-sectional view 18-18 of FIG. 18 is similar to that of FIG. 17 but represents the cross-section of the LDMOS transistor 100 taken longitudinally through the transistor between the fins 110 and 120. As such, neither fin is shown in FIG. 18. In this region, the transistor structure is analogous to a planar MOS transistor, in which the channel region is along the top surface 1010 (see FIG. 11) of the substrate 105. Thus the total channel width includes the sides and tops of the fins 110, 120 as well as the space between the fins 110, 120.

Figure 19:
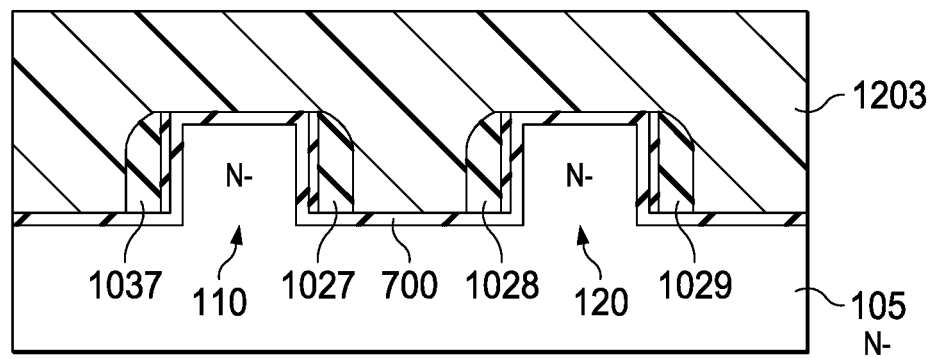

FIG. 19 illustrates the cross-sectional view 19-19 taken transversely through the region between the gate 810 and the field plate 820. Cross-sections of fins 110 and 120 are shown with spacers 1037 and 1029 formed on fin 110 and spacers 1028 and 1029 formed on fin 120. The dielectric portion 1203 covering this portion of the fins 110, 120 also is shown. This cross section is representative of the fins 110, 120 between the gate 810 and field plate 820, where the fins may operate as a drift or extended drain region of the LDMOS transistor 100.

Figure 20:
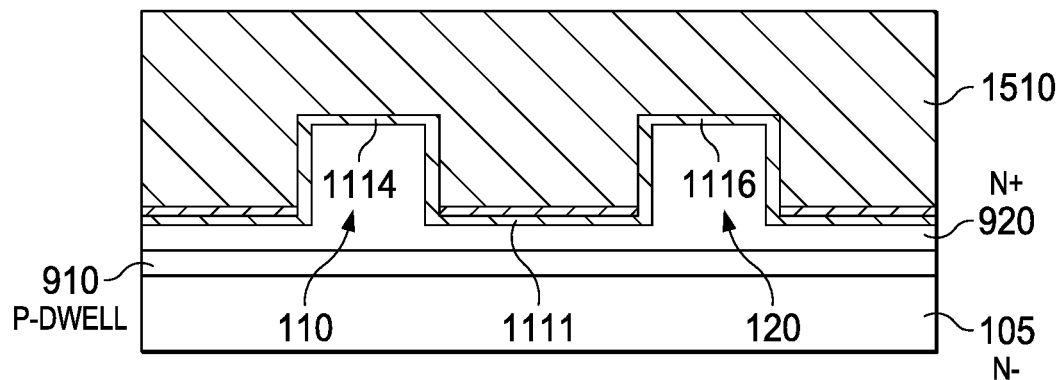

FIG. 20 illustrates the cross-sectional view 20-20 taken transversely through the LDMOS transistor 100 through metal contact 1510. Cross-sections of the fins 110 and 120 are shown with silicide 1114 formed on top of the fin 110 and silicide 1116 formed on top of the fin 120. The metal contact 1510 also is shown in contact with silicide 1114 and silicide 1115 of fins 110 and 120, respectively, providing a conductive contact to the source region 920 of the LDMOS transistor 100.

Figure 21:
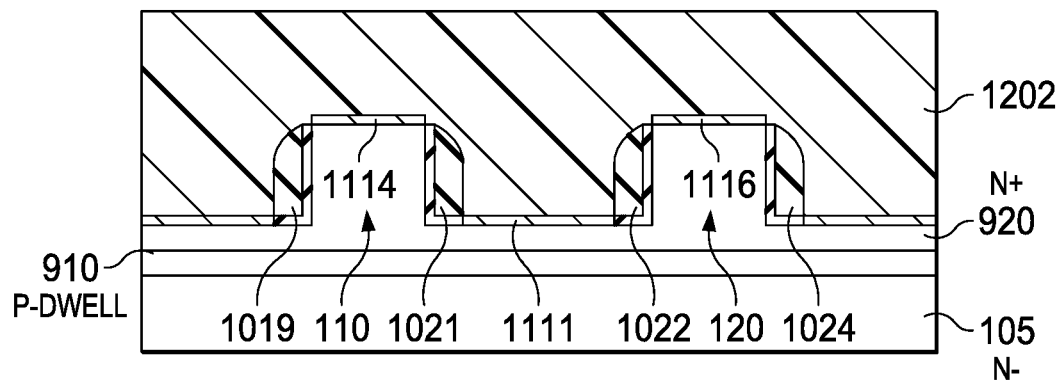

FIG. 21 illustrates the cross-sectional view 21-21 taken transversely through the LDMOS transistor 100, between metal contacts 1510 and 1530. Cross-sections of the fins 110 and 120 are shown with the spacers 1019 and 1021 formed on the fin 110, and the spacers 1022 and 1024 formed on the fin 120. The dielectric portion 1202 also is shown covering this portion of the fins 110, 120. The fins 110 and 120 are doped P-type in this region, and are part of the source region of the LDMOS transistor 100. Silicide 1114 and silicide 1116 provide a conductive path from the metal contact 1510 to the fins 110 and 120 in this region of the LDMOS transistor 100.

Figure 22:
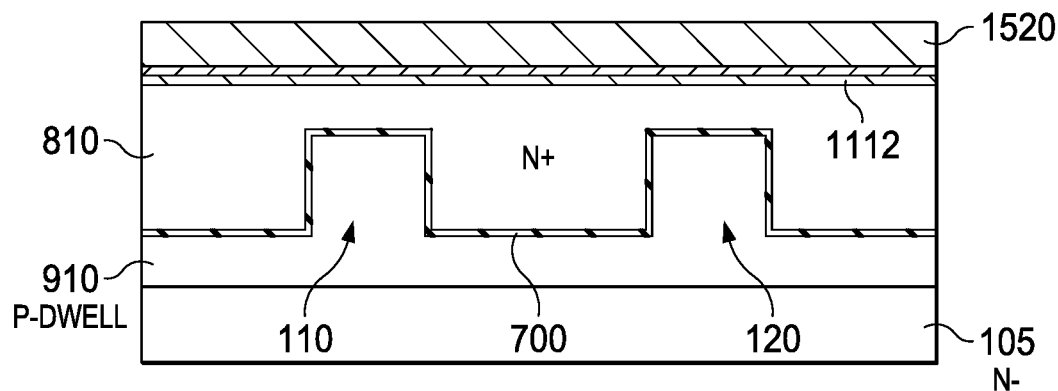

FIG. 22 illustrates the cross-sectional view 22-22 taken transversely through the gate 810. Cross-sections of the fins 110 and 120 are shown with the gate dielectric layer 700 formed thereon. Silicide 1112 is shown covering the top of the gate 810, with additional silicide 1410 thereover, though in practice only a single homogenous silicide layer may be present. The metal contact 1520 provides a conductive connection to the gate 810 via the silicide 1112.

Figure 23:
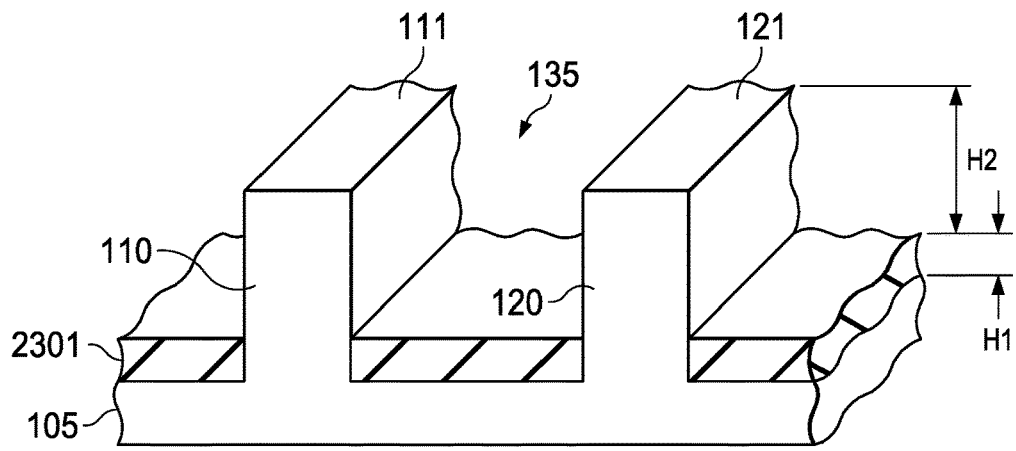
FIG. 23 illustrates an alternate example in which a dielectric layer is formed on the substrate surface between and adjacent to the fins.

FIG. 23 shows the state of the structure after the fins 110 and 120 are formed on the substrate 105 in an alternate example, in a view similar to that shown in FIG. 1A. In this example an oxide layer 2301 is formed in the trench 135 between the fins 110, 120, and also on the opposing sides of the fins. The oxide layer 2301 may be formed by HDP oxide deposition and CMP polish and/or etchback. As shown, the oxide 2301 only partially fills the trench in the vertical direction from the top surface of substrate 105 up to a height H1. The fins 110, 120 are uncovered for the remainder of their height, H2. The LDMOS transistor 100 may be formed using the exposed portions of the fins 110, 120. The source, body and drain regions are formed within the respective ends of the fins 110 and 120 above the oxide layer 2301. The portion of the fins 110, 120 that is covered by the oxide 2301 will not form an active part of the transistor 100. Thus, in this case the channel region will only be formed on the tops and sides of the fins 110 and 120, resulting in a reduction in channel density. The source regions formed in fin 110 and in fin 120 are interconnected by way of the source contact 1510. Similarly, the drain regions formed in fin 110 and in fin 120 are interconnected by way of the drain contact 1530. Although the channel density is reduced in this example, the resulting device is expected to have better isolation to the substrate 105, thereby being tolerant of higher voltages.

Figure 24:
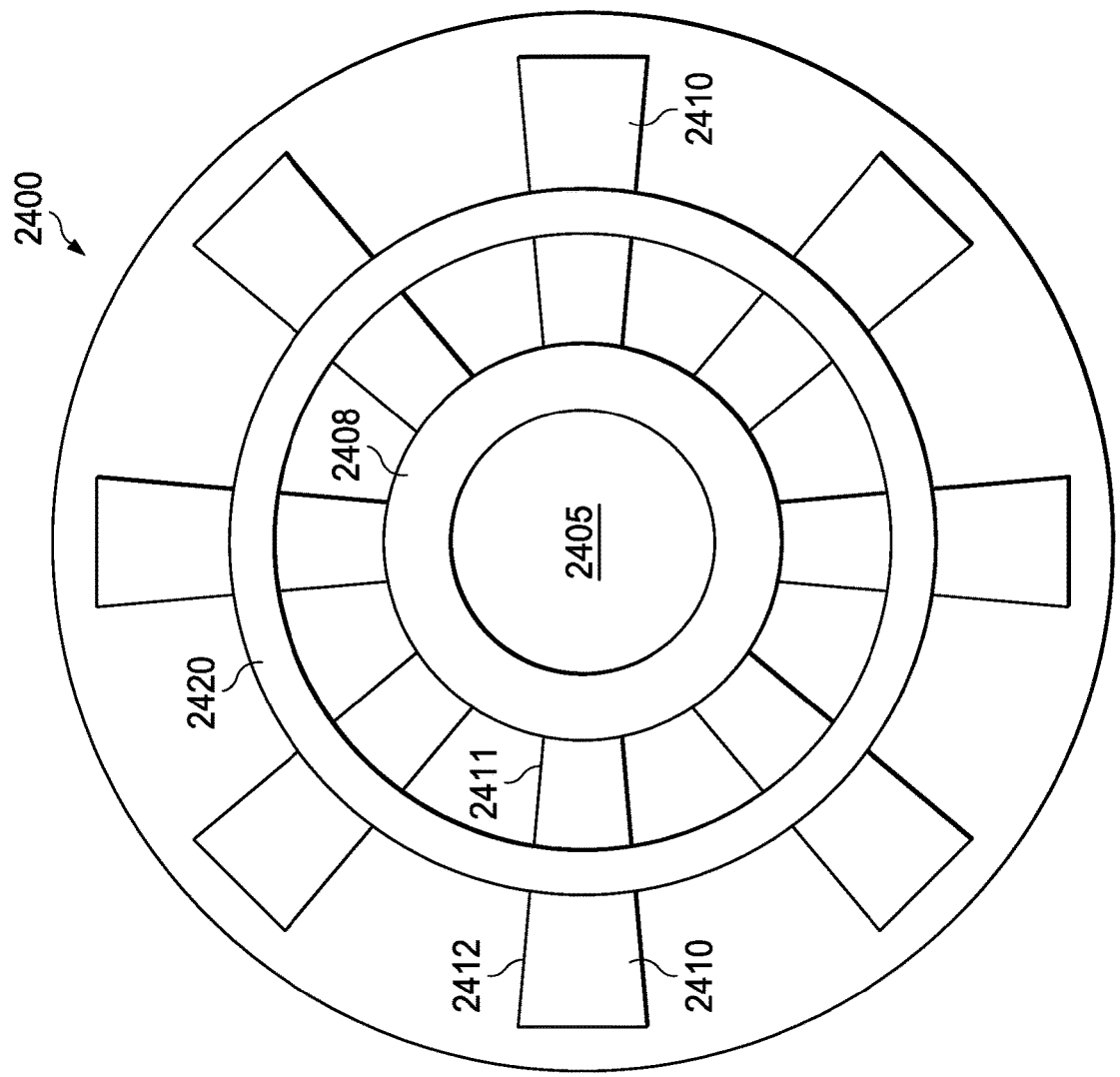
FIG. 24 illustrates an example of a fin-based electronic device, e.g. an LDMOS transistor, in which fins are oriented along radials of a circle and spoke pattern.

In FIGS. 1-23, the fins are rectilinear and extend parallel to each other. In an alternate example, FIG. 24 shows a fin-based LDMOS transistor 2400 in which fins 2410 are formed in a circle-and spoke-pattern. This pattern may result in a more compact transistor device in some cases. The fins 2410 are analogous to the fins 110, 120 of the LDMOS transistor 100. The fins 2410 extend from a source 2405 radially to an unpictured circular drain fin. The width of each fin 2410 is narrower at an end 2411 near the source 2405 and wider an outer end 2412. A gate 2408 is formed in a circular pattern as shown, as is a field plate 2420. The gate 2408 and field plate 2420 are analogous to the gate 810 and field plate 820, respectively, and may be formed in a similar manner.

Figure 25:
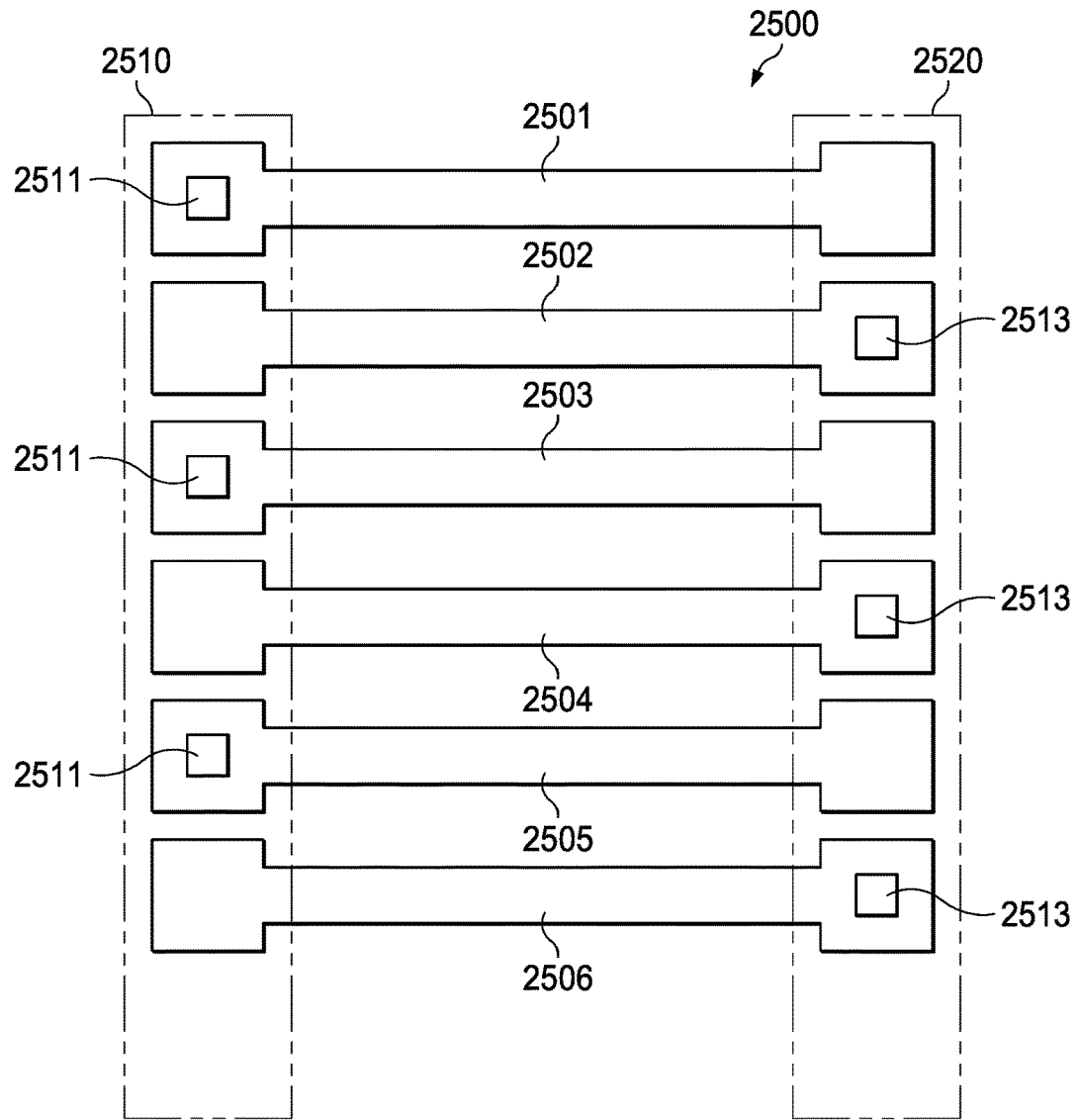
FIG. 25 illustrates an example of a fin-based capacitor.

Passive components also can be formed from silicon fins patterned directly on a silicon substrate in a similar manner to that described with respect to the fins 110 and 120 in FIG. 1A. FIG. 25 shows an example of a capacitor 2500 formed as two sets of interleaved fins. One set of fins includes fins 2501, 2503, and 2505, and the other set of fins includes fins 2502, 2504, and 2506. A first metal layer 2510 interconnects the left-hand edges of fins 2501, 2503, and 2505, as indicated by connection points 2511. A second metal layer 2520 interconnects the right-hand edges of fins 2502, 2504, and 2506, as indicated by connection points 2513. The two sets of fins are interleaved as shown and thus form a fin-based, interleaved capacitor, with metal layer 2510 acting as one electrode terminal of the capacitor, and metal layer 2520 acting as the other terminal.

Figure 26:
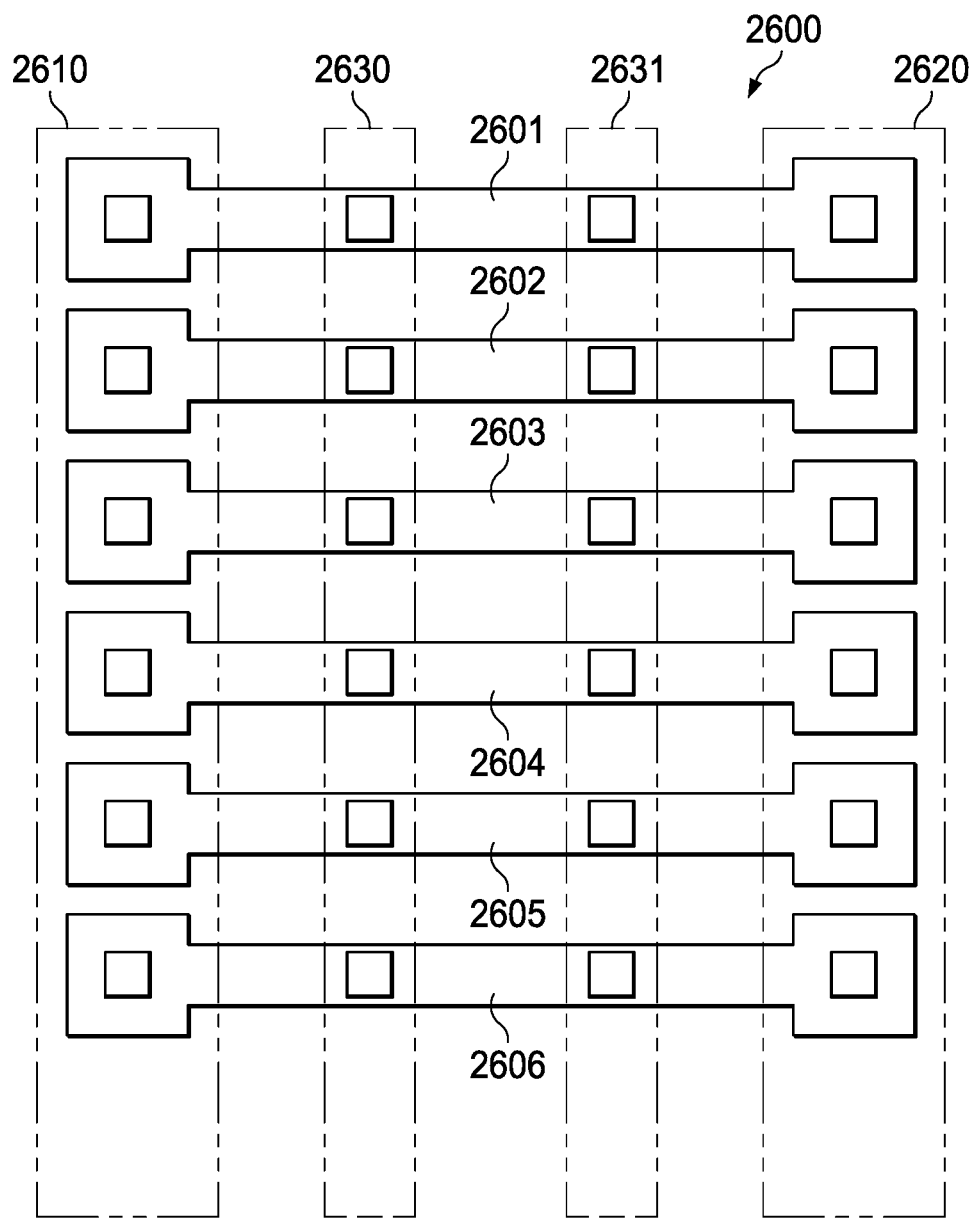
FIG. 26 illustrates another example of a fin-based capacitor.

FIG. 26 shows another example of a capacitor 2600 also formed from fins 2601-2606, metal layers 2610 and 2620, and polysilicon structures 2630 and 2631 analogous to the gate 810 and the field plate 820. The left-hand edges of the fins 2601-2606 are electrically connected together by way of the metal layer 2610, and the right-hand edges of the fins 2601-2606 are electrically connected together by way of metal layer 2620. One or both of the polysilicon structures 2630 and 2631 form one terminal of the capacitor 2600, and one or both of the metal layers 2610, 2620 forms the other capacitor terminal.

Figure 27:
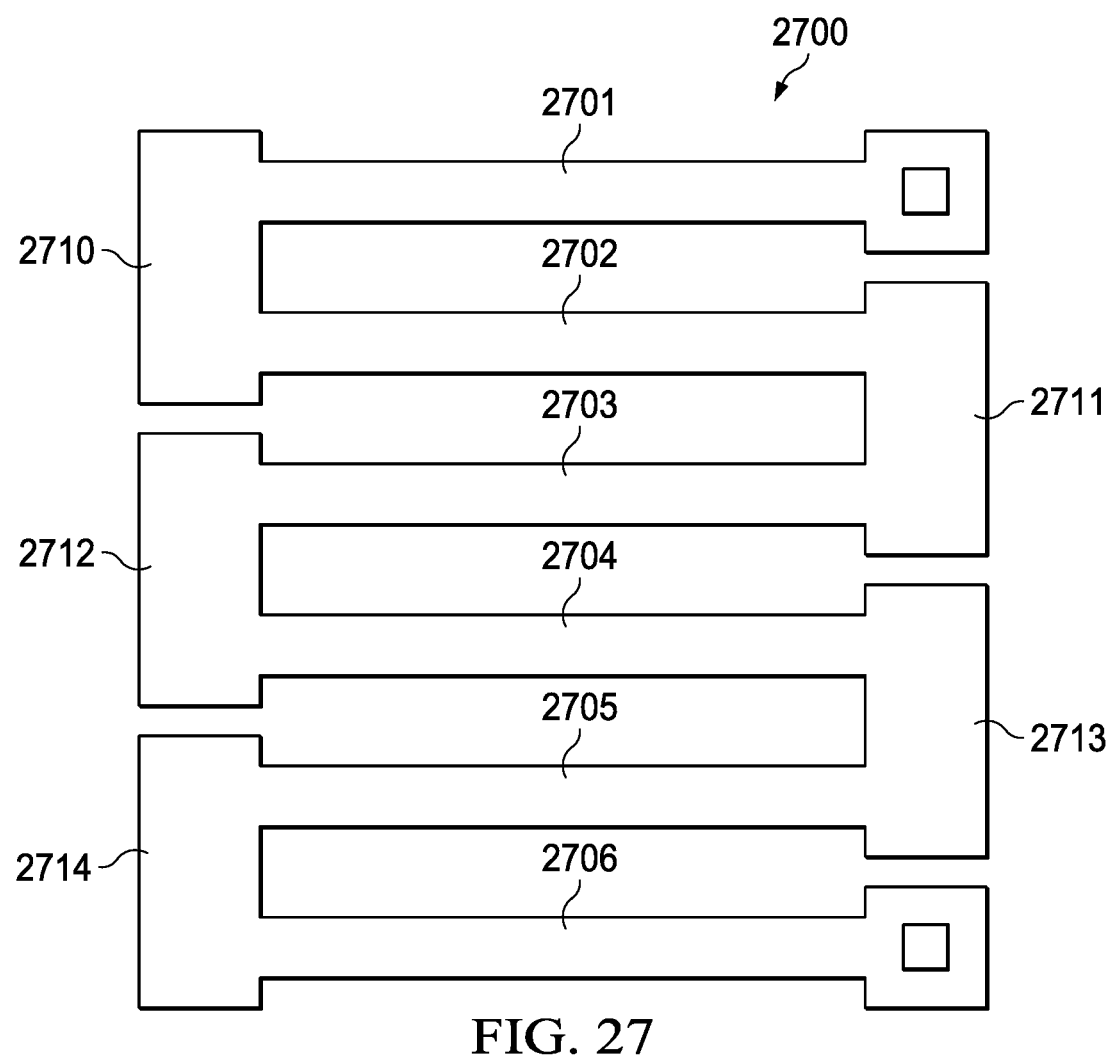
FIG. 27 illustrates an example of a fin-based resistor.

FIG. 27 illustrates an example of a serpentine resistor 2700 formed from a parallel set of fins 2701-2706. The fins 2701-2706 are doped so that that the resistor 2700 has a desired resistance. The left-hand edges of the fins 2701 and 2702 are connected together by a structure 2710. Structure 2710 can be another fin formed on the silicon substrate orthogonal to the long axis of the fins 2701-2706, or the structure 2710 can be a metal layer. Similarly, structure 2711 interconnects the right-hand edges of fins 2702 and 2703. Similarly, structures 2712, 2713, and 2714 interconnect the corresponding edges of fins 2703/2704, 2704/2705, and 2705/2706, respectively, to form a serpentine shaped resistor 2700 comprising silicon fins patterned into the silicon substrate such as described above with reference to FIG. 1A. The capacitors 2500 and 2600, and the resistor 2700 may provide consistent processing with the LDMOS transistor 100 when formed on a same substrate, thereby simplifying integration of these components to form an integrated circuit configured to perform a function.

Modifications are possible in the described embodiments, and other embodiments are possible, within the scope of the claims.

What is claimed is:

1. A method, comprising:
    forming a semiconductor fin having a first conductivity type extending upward from a surface of a semiconductor substrate;
    forming a well region having an opposite second conductivity type, the well region extending under and into a first location of the fin;
    forming a source region having the first conductivity type in the well region, the source region extending below the surface of the semiconductor substrate and into the first location of the fin;
    forming a drain region having the first conductivity type, the drain region extending under and into a second location of the fin; and
    forming a gate over the fin, the gate partially overlapping the well region and the source region.

2. The method of claim 1, further comprising forming a field plate over the semiconductor fin between the gate and the drain region.

3. The method of claim 1, wherein the semiconductor fin has a rectangular cross-section.

4. The method of claim 1, wherein the semiconductor fin is a first fin, further comprising forming a second semiconductor fin, the first and second fins being parallel and noncollinear.

5. The method of claim 1, wherein the semiconductor fin is a first fin, further comprising forming a second semiconductor fin, the first fin oriented along a first radial of a circle-and-spoke pattern, and the second fin oriented along a second radial of the circle-and-spoke pattern.

6. The method of claim 1, further comprising forming a silicide contact on an end face of the fin.

7. The method of claim 1, further comprising forming a first metal contact to the source region, a second metal contact to the drain region, and third metal contact to the gate.

8. The method of claim 7, wherein the first or second metal contact conductively connects to the fin at an end face of the fin.

9. The method of claim 1, further comprising forming a gate dielectric layer and a second dielectric layer on the fin, the second dielectric layer thicker than the gate dielectric layer, wherein the gate is located over a portion of the gate dielectric layer and the second dielectric layer, and the second dielectric layer extends on the fin from the gate to the drain region.

10. The method of claim 1, wherein the first conductivity type is N-type and the second conductivity type is P-type.

11. An integrated circuit, comprising:
    a semiconductor fin having a first conductivity type extending upward from a surface of a semiconductor substrate;
    a well region having an opposite second conductivity type located in the substrate, the well region extending under and into a first location of the fin;
    a source region having the first conductivity type in the well region, the source region extending below the surface of the semiconductor substrate and into the first location of the fin;
    a drain region having the first conductivity type located in the substrate, the drain region extending under and into a second location of the fin at a second position of the semiconductor fin; and
    a gate located over the semiconductor fin, the gate partially overlapping the well region and the source region.

12. The integrated circuit of claim 11, further comprising a field plate over the semiconductor fin between the gate and the drain region.

13. The integrated circuit of claim 11, wherein the semiconductor fin has a rectangular cross-section.

14. The integrated circuit of claim 11, wherein the semiconductor fin is a first fin, and further comprising a second semiconductor fin located over the substrate, the first and second fins being parallel and noncollinear.

15. The integrated circuit of claim 11, wherein the semiconductor fin is a first fin, and further comprising a second semiconductor fin, the first fin oriented along a first radial of a circle-and-spoke pattern, and the second fin oriented along a second radial of the circle-and-spoke pattern.

16. The integrated circuit of claim 11, further comprising a silicide contact formed on an end face of the fin.

17. The integrated circuit of claim 11, further comprising a first metal contact to the source region, a second metal contact to the drain region, and third metal contact to the gate.

18. The integrated circuit of claim 17, wherein the first or second metal contact conductively connects to the fin at an end face of the fin.

19. The integrated circuit of claim 11, further comprising a gate dielectric layer and a second dielectric layer formed on three sides of the fin, the second dielectric layer thicker than the gate dielectric layer, wherein the gate is located over a portion of the gate dielectric layer and the second dielectric layer, and the second dielectric layer extends on the fin from the gate to the drain region.

20. The integrated circuit of claim 11, wherein the first conductivity type is N-type and the second conductivity type is P-type.

21. A method, comprising:
- forming first and second semiconductor fins having a first conductivity type over a semiconductor substrate and directed along first and second radials projecting from a central semiconductor region;
- forming a source region having the first conductivity type in the central semiconductor region, the source region extending under and into the first and second fins at first ends of the fins;
- forming first and second drain regions having the first conductivity type and extending under and into opposite second ends of the fins; and
- forming a gate over the first and second fins, the gate partially overlapping the source region, the first and second fins and the gate forming a circle-and-spoke pattern.

\* \* \* \* \*